(12) United States Patent
Kuroda et al.

(10) Patent No.: US 7,031,199 B2
(45) Date of Patent: Apr. 18, 2006

(54) SEMICONDUCTOR MEMORY DEVICE

(75) Inventors: Naoki Kuroda, Kyoto (JP); Masashi Agata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 67 days.

(21) Appl. No.: 10/815,709

(22) Filed: Apr. 2, 2004

(65) Prior Publication Data
US 2004/0184322 A1 Sep. 23, 2004

Related U.S. Application Data

(62) Division of application No. 10/233,486, filed on Sep. 4, 2002, now Pat. No. 6,751,116.

(30) Foreign Application Priority Data

Sep. 6, 2001 (JP) ............... 2001-269872

(51) Int. Cl.
*G11C 11/34* (2006.01)
(52) U.S. Cl. .................. 365/189.03; 365/189.05
(58) Field of Classification Search ........... 365/189.03, 365/189.05
See application file for complete search history.

(56) References Cited

U.S. PATENT DOCUMENTS

| 5,455,798 | A | 10/1995 | McClure |
| 5,463,581 | A | 10/1995 | Koshikawa |
| 5,657,292 | A * | 8/1997 | McClure ............... 365/233 |
| 5,710,736 | A * | 1/1998 | Masuda et al. ........ 365/189.07 |
| 5,923,593 | A | 7/1999 | Hsu et al. |
| 6,111,796 | A * | 8/2000 | Chang et al. ............. 365/196 |
| 6,256,221 | B1 | 7/2001 | Holland et al. |
| 6,262,939 | B1 | 7/2001 | Matsui |
| 6,484,271 | B1* | 11/2002 | Gray ........................ 714/6 |

FOREIGN PATENT DOCUMENTS

| JP | 4-238193 A | 8/1992 |
| JP | 7-282582 | 10/1995 |
| JP | P2000-222876 A | 8/2000 |
| JP | 2000-268559 A | 9/2000 |
| JP | P2000-260885 A | 9/2000 |
| JP | P2000-311486 A | 11/2000 |
| JP | P2001-143466 A | 5/2001 |

* cited by examiner

*Primary Examiner*—Michael Tran
(74) *Attorney, Agent, or Firm*—McDermott Will & Emery LLP

(57) ABSTRACT

A port A of the path including a first transistor of a memory cell to be accessed, a first bit line pair, a first column selection switch and a data line pair interleaves with a port B of the path including a second transistor of the memory cell to be accessed, a second bit line pair, a second column selection switch and the data line pair in two cycles of a clock. A read amplifier amplifies data transferred from a bit line pair to the data line pair and outputs the resultant data to an input/output buffer in one cycle of the clock. The input/output buffer outputs the data received from the read amplifier to the outside in one cycle of the clock.

10 Claims, 19 Drawing Sheets

SEMICONDUCTOR MEMORY DEVICE

This application is a divisional of application Ser. No. 10/233,486 filed Sep. 4, 2002 now U.S. Pat. No. 6,751,116.

BACKGROUND OF THE INVENTION

The present invention relates to a semiconductor memory device such as DRAM (Dynamic Random Access Memory).

A semiconductor memory device called DRAM requires rewriting of memory cells and precharging of bit lines in every cycle time. Therefore, the cycle time required by the DRAM is about twice the access time. There is technology for reducing the cycle time to approximately the same length as that of the access time by apparently hiding precharge operation of the bit lines. One example of this technology is to cause two internal ports to interleave with each other by using the memory cells each including two transistors and a single capacitor. FIG. 19 schematically shows the structure of a DRAM using this technology. Each memory cell MC1 to MC4 of the DRAM includes two transistors Ta, Tb and a single capacitor C. This DRAM causes the following two ports A, B to interleave with each other: the port A formed by the path including transistor Ta, bit line BLa1 or BLa2, data bus DBa, and read amplifier and write driver 1103a; and the port B formed by the path including transistor Tb, bit line BLb1 or BLb2, data bus DBb, and read amplifier and write driver 1103b. Hereinafter, interleave operation will be described regarding the case where data is read from a memory cell.

A row decoder 1101 activates a word line WLa1, whereby the transistors Ta of the memory cells MC1, MC3 are turned ON. As a result, data stored in the capacitors C of the memory cells MC1, MC3 are read to the bit lines BLa1, BLa2 and then amplified by a sense amplifier (not shown). A column decoder 1102a selects the bit line BLa1 and connects the bit line BLa1 to the data bus DBa. As a result, the data read from the memory cell MC1 to the bit line BLa1 is transferred to the data bus DBa. The data read to the bit lines BLa1, BLa2 are rewritten to the memory cells MC1, MC3. The row decoder 1101 then inactivates the word line WLa1, whereby the transistors Ta of the memory cells MC1, MC3 are turned OFF. The bit lines BLb1, BLb2 are precharged during the above operation.

The data transferred to the data bus DBa is amplified by the read amplifier and write driver 1103a for output to an input/output (I/O) buffer 1104. The I/O buffer 1104 outputs the amplified data to the outside. On the other hand, the row decoder 1101 activates a word line WLb2, whereby the transistors Tb of the memory cells MC2, MC4 are turned ON. As a result, data stored in the capacitors C of the memory cells MC2, MC4 are read to the bit lines BLb1, BLb2 and amplified by a sense amplifier (not shown). A column decoder 1102b selects the bit line BLb1 and connects the bit line BLb1 to the data bus DBb. As a result, the data read from the memory cell MC2 to the bit line BLb1 is transferred to the data bus DBb. The data read to the bit lines BLb1, BLb2 are rewritten to the memory cells MC2, MC4. The row decoder 1101 then inactivates the word line WLb2, whereby the transistors Tb of the memory cells MC2, MC4 are turned OFF. The bit lines BLa1, BLa2 are precharged during the above operation.

The data transferred to the data bus DBb is amplified by the read amplifier and write driver 1103b for output to the I/O buffer 1104. The I/O buffer 1104 outputs the amplified data to the outside.

Such interleave operation of the two internal ports apparently hides precharge operation of the bit lines, thereby reducing the cycle time to approximately the same length as that of the access time.

The DRAM of FIG. 19 has a read amplifier and write driver for each port. In other words, the DRAM of FIG. 19 has a read amplifier and write driver 1103a for the port A and a read amplifier and write driver 1103b for the port B. This increases the area of peripheral circuitry including the read amplifiers and write drivers if a specification using a large bit width is required (e.g., an embedded DRAM).

SUMMARY OF THE INVENTION

It is an object of the present invention to provide a semiconductor memory device enabling reduction in layout area.

According to one aspect of the present invention, a semiconductor memory device includes a plurality of memory cells, a plurality of first and second word lines, and a plurality of first and second bit lines. The plurality of memory cells are arranged in rows and columns. The plurality of first and second word lines are arranged in the rows. The plurality of first and second bit lines are arranged in the columns. Each of the plurality of memory cells includes a first transistor, a second transistor and a capacitor. The first transistor is connected between a corresponding first bit line and the capacitor and receives a voltage on a corresponding first word line at its gate. The second transistor is connected between a corresponding second bit line and the capacitor and receives a voltage on a corresponding second word line at its gate. The semiconductor memory device further includes a data line, a plurality of first and second column selection switches, a word line driver, a column selection circuit, an input/output (I/O) buffer, and a data transfer circuit. The plurality of first column selection switches are provided corresponding to the plurality of first bit lines, and each connects and disconnects a corresponding first bit line to and from the data line. The plurality of second column selection switches are provided corresponding to the plurality of second bit lines, and each connects and disconnects a corresponding second bit line to and from the data line. The word line driver drives first and second word lines corresponding to a memory cell to be accessed. The column selection circuit turns ON/OFF first and second column selection switches corresponding to the memory cell to be accessed. The I/O buffer receives and outputs data from and to the outside. The data transfer circuit transfers data read from a memory cell to the data line to the I/O buffer and transfers write data from the I/O buffer to the data line. The word line driver and the column selection circuit conduct interleave operation, and the data transfer circuit and the I/O buffer do not conduct interleave operation.

In the above semiconductor memory device, peripheral circuitry including the data transfer circuit is required for only one port, thereby enabling reduction in layout area.

Preferably, the data line includes a write data line and a read data line. Each of the plurality of first and second column selection switches connects and disconnects a corresponding bit line to and from the write data line in order to write data to a memory cell. Each of the plurality of first and second column selection switches connects and disconnects the corresponding bit line to and from the read data line in order to read data from a memory cell.

In the above semiconductor memory device, the read data line need only be controlled for read operation, and the write data line need only be controlled for write operation. This facilitates control of the write data line and the read data line and timing design as compared to the case where a single data line is controlled for both read and writ operations.

Preferably, the data line is a single-type data line.

The above semiconductor memory device eliminates the need to consider precharge operation of the bit lines, enabling quick design.

According to another aspect of the present invention, a semiconductor memory device includes a plurality of memory cells, a plurality of first and second word lines, and a plurality of first and second bit lines. The plurality of memory cells are arranged in rows and columns. The plurality of first and second word lines are arranged in the rows. The plurality of first and second bit lines are arranged in the columns. Each of the plurality of memory cells includes a first transistor, a second transistor and a capacitor. The first transistor is connected between a corresponding first bit line and the capacitor and receives a voltage on a corresponding first word line at its gate. The second transistor is connected between a corresponding second bit line and the capacitor and receives a voltage on a corresponding second word line at its gate. The semiconductor memory device further includes first and second data lines, a plurality of first and second column selection switches, a word line driver, a column selection circuit, an input/output (I/O) buffer, a data transfer circuit, and a switching means. The plurality of first column selection switches are provided corresponding to the plurality of first bit lines, and each connects and disconnects a corresponding first bit line to and from the first data line. The plurality of second column selection switches are provided corresponding to the plurality of second bit lines, and each connects and disconnects a corresponding second bit line to and from the second data line. The word line driver drives first and second word lines corresponding to a memory cell to be accessed. The column selection circuit turns ON/OFF first and second column selection switches corresponding to the memory cell to be accessed. The I/O buffer receives and outputs data from and to the outside. The switching means transfers data read from a memory cell to the first or second data line to the data transfer circuit, and transfers the data from the data transfer circuit to the first or second data line. The data transfer circuit transfers data from the switching means to the I/O buffer, and transfers data from the I/O buffer to the switching means. The word line driver, the column selection circuit and the switching means conduct interleave operation, and the data transfer circuit and the I/O buffer do not conduct interleave operation.

In the above semiconductor memory device, peripheral circuitry including the data transfer circuit is required for only one port, thereby enabling reduction in layout area.

Moreover, the first and second data lines provided on the memory cell arrays and subjected to relatively large load conduct interleave operation. This enables the semiconductor memory device to be designed with a data transfer margin.

Preferably, the semiconductor memory device further includes a read data line and a write data line. The read data line is a data line for transferring data from the switching means to the I/O buffer. The write data line is a data line for transferring data from the I/O buffer to the switching means.

In the above semiconductor memory device, the read data line need only be controlled for read operation, and the write data line need only be controlled for write operation. This facilitates control of the write data line and the read data line and timing design as compared to the case where a single data line is controlled for both read and writ operations.

According to still another aspect of the present invention, a semiconductor memory device includes a plurality of memory cells, a plurality of word lines, a plurality of bit line pairs, a data line pair, a decoder, a write circuit, a plurality of first to fourth transistors and a column selection circuit. The plurality of memory cells are arranged in rows and columns. The plurality of word lines are arranged in the rows. The plurality of bit line pairs are arranged in the columns. The decoder generates an active signal when data is written to any of the plurality of memory cells. The write circuit is responsive to the active signal from the decoder, and activates one or the other data line of the data line pair according to write data. The plurality of first transistors are connected between one data line of the data line pair and one bit lines of the plurality of bit line pairs, and turned ON/OFF in response to a voltage on the one data line of the data line pair. The plurality of second transistors are connected between the other data line of the data line pair and the other bit lines of the plurality of bit line pairs, and turned ON/OFF in response to a voltage on the other data line of the data line pair. The plurality of third transistors are connected between the plurality of first transistors and one bit lines of the plurality of bit line pairs. The plurality of fourth transistors are connected between the plurality of second transistors and the other bit lines of the plurality of bit line pairs. The column selection circuit applies an active signal to a gate of one of the plurality of third transistors which corresponds to a bit line pair corresponding to a memory cell to be written and applies an active signal to a gate of one of the fourth transistors which corresponds to the bit line pair.

In the above semiconductor memory device, the plurality of first and second transistors for transferring data from the data line pair to the bit line pair are turned ON/OFF by the voltage on the data line pair. As a result, signal lines for turning ON/OFF the plurality of first and second transistors need not be provided in the column direction. This enables reduction in layout area of wiring layers.

Moreover, power supply lines can be provided instead of the signal lines for turning ON/OFF the plurality of first and second transistors. This not only reinforces the power supply but also improves the shielding effect of the data line pair.

Preferably, the plurality of first transistors are turned ON/OFF in response to a voltage on the other data line of the data line pair instead of the voltage on the one data line of the data line pair, and the plurality of second transistors are turned ON/OFF in response to a voltage on the one data line of the data line pair instead of the voltage on the other data line of the data line pair.

The above semiconductor memory device prevents a write voltage to the bit line pair from being varied by a threshold voltage of the first or second transistor.

According to yet another aspect of the present invention, a semiconductor memory device includes a plurality of memory cells, a plurality of word lines, a plurality of bit line pairs, a data line pair, a decoder, a write circuit, a plurality of first to fourth transistors, and a column selection circuit. The plurality of memory cells are arranged in rows and columns. The plurality of word lines are arranged in the rows. The plurality of bit line pairs are arranged in the columns. The decoder generates an active signal when data is written to any of the plurality of memory cells. The write circuit is responsive to the active signal from the decoder, and activates one or the other data line of the data line pair according to write data. The plurality of first transistors are connected between a node receiving a power supply voltage or a ground voltage and one bit lines of the plurality of bit line pairs, and are turned ON/OFF in response to a voltage on one data line of the data line pair. The plurality of second transistors are connected between the node and the other bit lines of the plurality of bit line pairs, and are turned ON/OFF in response to a voltage on the other data line of the data line pair. The plurality of third transistors are connected between the plurality of first transistors and one bit lines of the plurality of bit line pairs. The plurality of fourth transistors are connected between the plurality of second transistors and the other bit lines of the plurality of bit line pairs. The column selection circuit applies an active signal to a gate of one of the plurality of third transistors which corresponds to a bit line pair corresponding to a memory cell to be written and applies an active signal to a gate of one of the fourth transistors which corresponds to the bit line pair.

In the above semiconductor memory device, the plurality of first and second transistors for transferring data to the bit line pair are turned ON/OFF by the voltage on the data line pair. As a result, signal lines for turning ON/OFF the plurality of first and second transistors need not be provided in the column direction. This enables reduction in layout area of wiring layers.

Moreover, a circuit for precharging the data line pair is not required, enabling reduction in layout area and power consumption.

Preferably, the first and second transistors are CMOS (Complementary Metal Oxide Semiconductor) transistors.

Preferably, the above semiconductor memory device further includes a sense amplifier for amplifying a potential difference of a bit line pair corresponding to a memory cell to be written after the bit line pair is driven according to write data.

Preferably, the semiconductor memory device further includes a precharge circuit. The precharge circuit precharges a bit line pair corresponding to a memory cell to be written for a predetermined period after the bit line pair is driven according to write data until the sense amplifier amplifies a potential difference of the bit line pair.

In the above semiconductor memory device, the bit line to which data is read from the memory cell is pulled up or pulled down to the precharge level. This ensures the potential difference between the bit lines at least in read operation, whereby a sufficient write operation margin is obtained.

According to a further aspect of the present invention, a semiconductor memory device includes a first main amplifier, a first tri-state buffer, and a first latch circuit. The first main amplifier is activated in response to an active first enable signal, and amplifies data read from a first memory cell. When the first enable signal is active, the first tri-state buffer drives an output node of the first tri-state buffer according to the data amplified by the first main amplifier. When the first enable signal is inactive, the first tri-state buffer renders the output node in a high impedance state. The first latch circuit latches and outputs data of the output node of the first tri-state buffer to the outside.

In the above semiconductor memory device, data can be rapidly output to the outside without conducting any timing adjustment in the first latch circuit after activation of the first main amplifier.

When the first enable signal is inactive, the first tri-state buffer renders the output node in the high impedance state. This prevents data held in the first latch circuit from being destroyed.

Preferably, the above semiconductor memory device further includes a second latch circuit and a switch. The switch is connected between the output node of the tri-state buffer and the second latch circuit. In a test mode, the switch connects the output node of the tri-state buffer to the second latch circuit. In a normal mode, the switch disconnects the output node of the tri-state buffer from the second latch circuit.

In the above semiconductor memory device, the switch is provided between the output node of the tri-state buffer and the second latch circuit. This reduces the load on the output buffer as compared to the case where a plurality of normal outputs are electrically gathered at the output end by using a switch or the like and examined as a single test output. This enables signal transmission to a system receiving the output data to be conducted in the same manner as that in the normal mode.

Moreover, the switch provided between the output node of the tri-state buffer and the second latch circuit eliminates the need for timing adjustment of the latch circuit used in the test mode. Accordingly, the test data is rapidly output to the outside without timing control after activation of the first main amplifier.

Preferably, the above semiconductor memory device further includes a second main amplifier, a second tri-state buffer, a second latch circuit, and a switch. The second main amplifier is activated in response to an active second enable signal, and amplifies data read from a second memory cell. When the second enable signal is active, the second tri-state buffer drives an output node of the second tri-state buffer according to the data amplified by the second main amplifier. When the second enable signal is inactive, the second tri-state buffer renders the output node in a high impedance state. The second latch circuit latches and outputs data of the output node of the second tri-state buffer to the outside. The switch is connected between an output node of the first latch circuit and an output node of the second latch circuit, and is turned ON/OFF according to a bit width of read data.

In the above semiconductor memory device, the switch is provided between the output node of the first latch circuit and the output node of the second latch circuit. This eliminates the need for timing adjustment of the first and second latch circuits even when the bit width of read data is varied.

Preferably, in the above semiconductor memory device, either the first or second latch circuit that is not used is not allowed to conduct latch operation.

The above semiconductor memory device prevents data conflict between the first and second latch circuits.

According to a still further aspect of the present invention, a semiconductor memory device includes an output buffer for outputting data read from a memory cell to an output terminal. The output buffer includes first and second buffers. The first buffer drives the output terminal according to the data read from the memory cell. The second buffer has an active state and an inactive state. In the active state, the second buffer drives the output terminal according to the data read from the memory cell.

The above semiconductor memory device is capable of varying the driving capability of the output buffer by activating and inactivating the second buffer.

Preferably, the second buffer is activated and inactivated according to a bit width of the data read from the memory cell.

The above semiconductor memory device is capable of varying the driving capability of the output buffer according to the bit width of the data read from the memory cell. This reduces variation in access time depending on the bit width.

Preferably, the second buffer is activated and inactivated according an external signal capable of recognizing the bit width of the data read from the memory cell.

Preferably, the second buffer is activated and inactivated by using a fuse element representing the bit width of the data read from the memory cell.

Preferably, the semiconductor memory device further includes a detector. The detector detects an operating frequency of the semiconductor memory device. The second buffer is activated and inactivated according to the operating frequency detected by the detector.

The above semiconductor memory device is capable of varying the driving capability of the output buffer according to the operating frequency. This optimizes power consumption.

According to a yet further aspect of the present invention, a semiconductor memory device includes a plurality of memory cells, a plurality of word lines, a plurality of bit line pairs, a data line pair, a plurality of first to fourth transistors, a column selection circuit and a write circuit. The plurality of memory cells are arranged in rows and columns. The plurality of word lines are arranged in the rows. The plurality of bit line pairs are arranged in the columns. The plurality of first transistors are connected between a node receiving a first voltage and one bit lines of the plurality of bit line pairs, and are turned ON/OFF in response to a voltage on one data line of the data line pair. The plurality of second transistors are connected between the node and the other bit lines of the plurality of bit line pairs, and are turned ON/OFF in response to a voltage on the other data line of the data line pair. The plurality of third transistors are connected between the plurality of first transistors and one bit lines of the plurality of bit line pairs. The plurality of fourth transistors are connected between the plurality of second transistors and the other bit lines of the plurality of bit line pairs. The column selection circuit applies an active signal to a gate of one of the plurality of third transistors which corresponds to a bit line pair corresponding to a memory cell to be written and applies an active signal to a gate of one of the fourth transistors which corresponds to the bit line pair. When data is written to any of the plurality of memory cells, the write circuit activates one or the other data line of the data line pair according to write data and a level of the first voltage received by the node.

In the above semiconductor memory device, when the node receives a power supply voltage, data can be written to a memory cell by pulling up one or the other bit line of a bit line pair. On the other hand, when the node receives a ground voltage, data can be written to a memory cell by pulling down one or the other bit line of a bit line pair. Accordingly, when the precharge level of the bit line pair becomes higher than a predetermined level, the ground voltage is applied to the node. On the other hand, when the precharge level of the bit line pair becomes lower than the predetermined level, the power supply voltage is applied to the node. This enables write operation to be conducted with a greater margin.

Preferably, the above semiconductor memory device further includes a means for supplying a power supply voltage or a ground voltage to the node as the first voltage according to an address specifying the plurality of memory cells.

The above semiconductor memory device is capable of controlling the voltage level on the node according to the address.

Preferably, the above semiconductor memory device further includes a means for supplying a power supply voltage or a ground voltage to the node as the first voltage according to an operating frequency of the semiconductor memory device.

The above semiconductor memory device is capable of controlling the voltage level on the node according to the operating frequency. This ensures a sufficient write operation margin even when the precharge level of the bit line pairs varies according to the operating frequency.

Preferably, the above semiconductor memory device further includes a means for supplying a power supply voltage or a ground voltage to the node as the first voltage according to a precharge potential of one of the plurality of bit line pairs.

The above semiconductor memory device is capable of controlling the voltage level on the node according to the precharge potential of one of the plurality of bit line pairs. This assures a sufficient write operation margin even if the precharge level of the bit line pair varies for other reason.

Preferably, the above semiconductor memory device further includes a means for supplying a power supply voltage or a ground voltage to the node as the first voltage according to external control.

The above semiconductor memory device allows the voltage level on the node to be controlled from the outside. Accordingly, which of the write operation by pulling up one or the other bit line of a bit line pair and the write operation by pulling down one or the other bit line of a bit line pair ensures a greater write operation margin can be examined upon inspecting and evaluating the chips. A write method ensuring a greater write operation margin can be applied based on the examination result.

DESCRIPTION OF THE PREFERRED EMBODIMENTS

Figure 1:
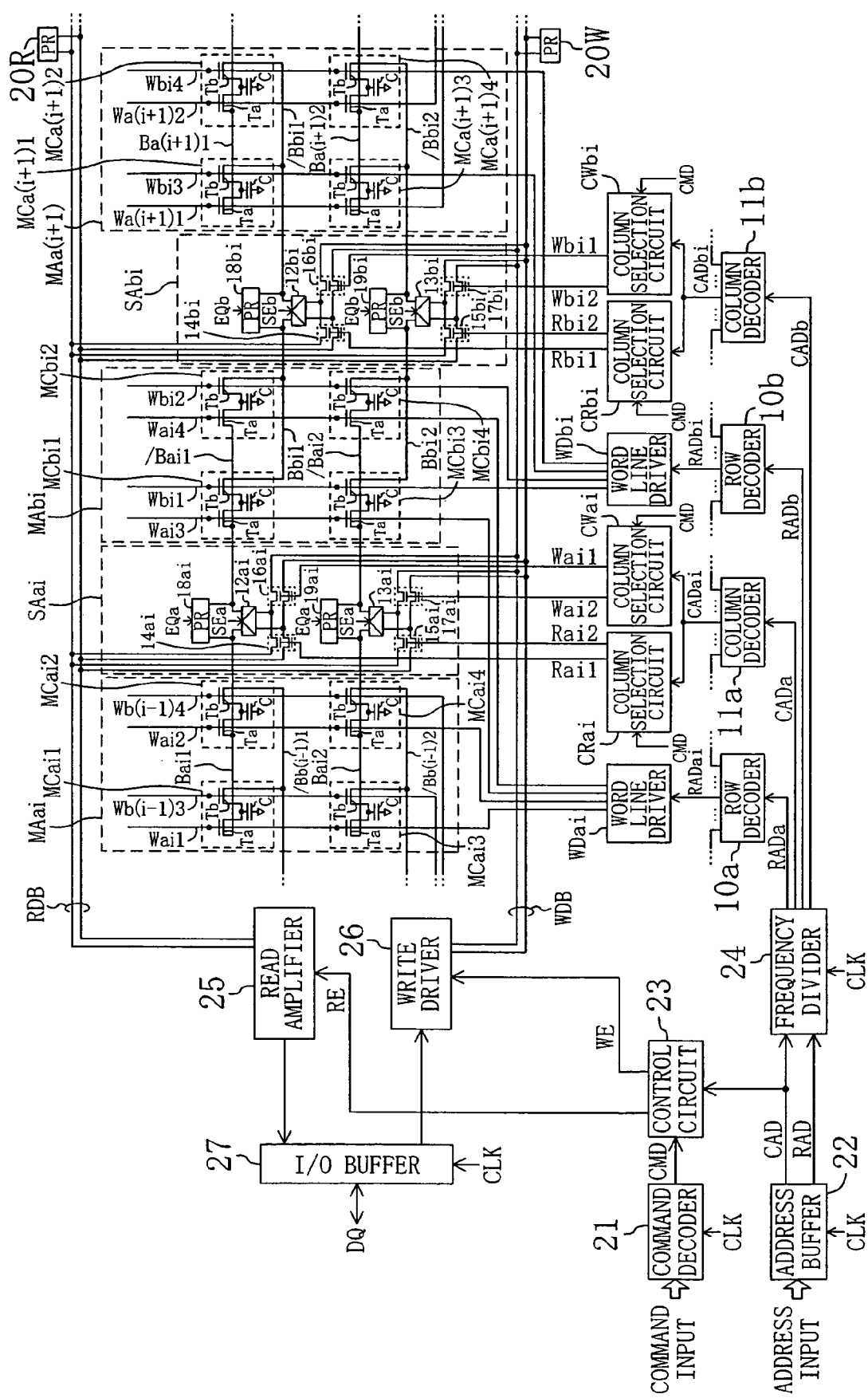
FIG. 1 is a block diagram showing the overall structure of a DRAM according to a first embodiment of the present invention.

Hereinafter, embodiments of the present invention will be described in detail with reference to the accompanying drawings. Note that the same or corresponding portions are denoted with the same reference numerals and characters throughout the figures, and description thereof will not be repeated.

(First Embodiment)

[Overall Structure of the DRAM]

FIG. 1 is a block diagram showing the overall structure of the DRAM according to the first embodiment of the present invention. The DRAM of FIG. 1 is a synchronous DRAM operating in synchronization with a clock CLK. This DRAM includes memory cell arrays MAai, MAbi (where i is in the range of 1 to n, and n is a positive integer), sense amplifier arrays SAai, SAbi (where i is in the range of 1 to n, and n is a positive integer), row decoders 10a, 10b, column decoders 11a, 11b, word line drivers WDai, WDbi (where i is in the range of 1 to n, and n is a positive integer), column selection circuits CRai, CWai, CRbi, CWbi (where i is in the range of 1 to n, and n is a positive integer), a read data line pair RDB, a write data line pair WDB, data line precharge circuits 20R, 20W, a command decoder 21, an address buffer 22, a control circuit 23, a frequency divider 24, a read amplifier 25, a write driver 26, and an input/output (I/O) buffer 27.

The memory cell arrays and the sense amplifier arrays are arranged in the column direction in the following order: memory cell array MAa1, sense amplifier array SAa1, memory cell array MAb1, sense amplifier array SAb1, memory cell array MAa2, . . . . Note that, for simplicity of description, FIG. 1 shows only the memory cell arrays MAai, MAbi, MAa(i+1), the sense amplifiers SAai, SAbi, the word line drivers WDai, WDbi and the column selection circuits CRai, CWai, CRbi, CWbi.

The memory cell array MAai includes memory cells MCai1 to MCai4, word lines Wai1, Wai2, Wb(i−1)3, Wb(i−1)4 and bit lines Bai1, Bai2, /Bb(i−1)1, /Bb(i−1)2. The memory cells MCai1 to MCai4 are arranged in rows and columns. The word lines Wai1, Wai2, Wb(i−1)3, Wb(i−1)4 are arranged in rows. The word lines Wai1, Wb(i−1)3 are provided corresponding to the memory cells MCai1, MCai3. The word lines Wai2, Wb(i−1)4 are provided corresponding to the memory cells MCai2, MCai4. The bit lines Bai1, Bai2, /Bb(i−1)1, /Bb(i−1)2 are arranged in columns. The bit lines Bai1, /Bb(i−1)1 are provided corresponding to the memory cells MCai1, MCai2. The bit lines Bai2, /Bb(i−1)2 are provided corresponding to the memory cells MCai3, MCai4.

Each memory cell MCai1 to MCai4 includes two transistors Ta, Tb and a single capacitor C. The transistor Ta of the memory cell MCai1 is connected between the bit line Bai1 and the capacitor C and receives the voltage on the word line Wai1 at its gate. The transistor Tb of the memory cell MCai1 is connected between the bit line /Bb(i−1)1 and the capacitor C and receives the voltage on the word line Wb(i−1)3 at its gate. The transistors Ta of the memory cells MCai2 to MCai4 are connected between the bit lines Bai1, Bai2, Bai2 and the respective capacitors C and receive the voltage on the word lines Wai2, Wai1, Wai2 at their gates, respectively. The transistors Tb of the memory cells MCai2 to MCai4 are connected between the bit lines /Bb(i−1)1, /Bb(i−1)2, /Bb(i−1)2 and the respective capacitors C and receive the voltage on the word lines Wb(i−1)4, Wb(i−1)3, Wb(i−1)4 at their gates, respectively.

The memory cell array MAbi includes memory cells MCbi1 to MCbi4, word lines Wai3, Wai4, Wbi1, Wbi2 and bit lines /Bai1, /Bai2, Bbi1, Bbi2. The memory cells MCbi1 to MCbi4 are arranged in rows and columns. The word lines Wai3, Wai4, Wbi1, Wbi2 are arranged in rows. The word lines Wai3, Wbi1 are provided corresponding to the memory cells MCbi1, MCbi3. The word lines Wai4, Wbi2 are provided corresponding to the memory cells MCbi2, MCbi4. The bit lines /Bai1, /Bai2, Bbi1, Bbi2 are arranged in columns. The bit lines /Bai1, Bbi1 are provided corresponding to the memory cells MCbi1, MCbi2. The bit lines /Bai2, Bbi2 are provided corresponding to the memory cells MCbi3, MCbi4.

Each memory cell MCbi1 to MCbi4 includes two transistors Ta, Tb and a single capacitor C. The transistors Ta of the memory cells MCbi1 to MCbi4 are connected between the bit lines /Bai1, /Bai1, /Bai2, /Bai2 and the respective capacitors C and receive the voltage on the word lines Wai3, Wai4, Wai3, Wai4 at their gates, respectively. The transistors Tb of the memory cells MCbi1 to MCbi4 are connected between the bit lines Bbi1, Bbi1, Bbi2, Bbi2 and the respective capacitors C and receive the voltage on the word lines Wbi1, Wbi2, Wbi1, Wbi2 at their gates, respectively.

The command decoder 21 fetches an external command in synchronization with the clock CLK and outputs a corresponding command signal CMD.

The address buffer 22 fetches an external address in synchronization with the clock CLK and outputs a corresponding row address signal RAD and a corresponding column address signal CAD.

The control circuit 23 activates enable signals WE, RE in response to the command signal CMD from the command decoder 21 and the column address signal CAD from the address buffer 22. More specifically, the control circuit 23 activates the enable signal RE when the command signal CMD indicates "read operation", and activates the enable signal RE when the command signal CMD indicates "write operation".

Figure 2:
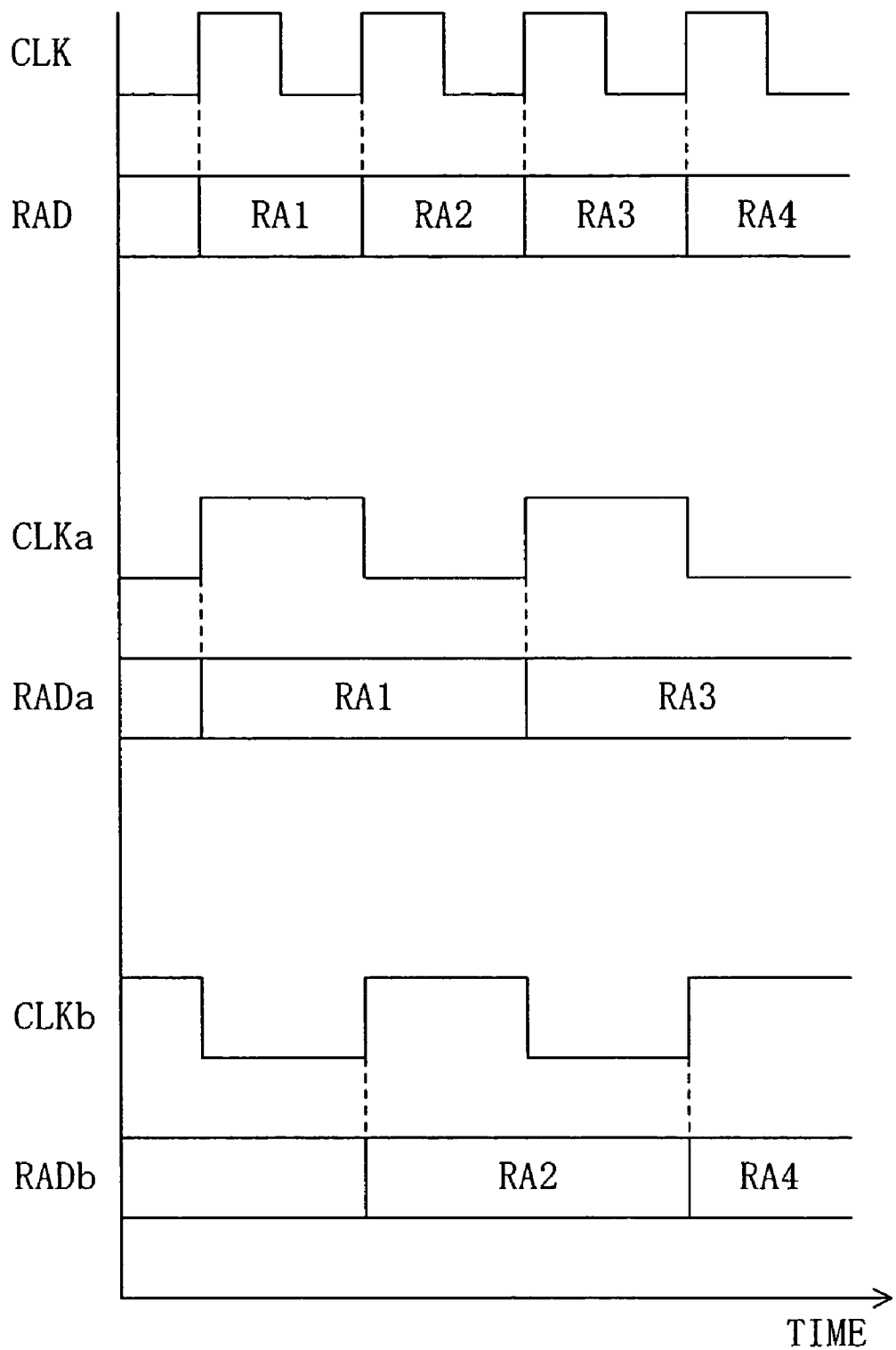
FIG. 2 is a timing chart illustrating operation of a frequency divider in FIG. 1.

The frequency divider 24 receives the row address signal RAD and the column address signal CAD from the address buffer 22 and outputs row address signals RADa, RADb and column address signals CADa, CADb with a cycle that is twice the cycle of the clock CLK. More specifically, as shown in FIG. 2, the address buffer 22 applies the row address signal RAD (RA1 to RA4) to the frequency divider 24 in synchronization with the clock CLK. The frequency divider 24 fetches the row address signal RAD (RA1, RA3) in synchronization with a clock CLKa having a cycle that is twice the cycle of the clock CLK, and outputs a row address signal RADa (RA1, RA3). The frequency divider 24 also fetches the row address signal RAD (RA2, RA4) in synchronization with a clock CLKb that is complementary to the clock CLKa, and outputs a row address signal RADb (RA2, RA4). The same applies to the column address signals CAD, CADa, CADb.

In response to the row address signal RADa from the frequency divider 24, the row decoder 10a applies a row address signal RADai to one of the word line drivers WDa1 to WDan which corresponds to the row address signal RADa, that is, the word line driver WDai.

In response to the row address signal RADb from the frequency divider 24, the row decoder 10b applies a row address signal RADbi to one of the word line drivers WDb1 to WDbn which corresponds to the row address signal RADb, that is, the word line driver WDbi.

The word line driver WDai is provided corresponding to the memory cell arrays MAai, MAbi. The word line driver WDai activates a corresponding word line Wai1, Wai2, Wai3, Wai4 in response to the row address signal RADai from the row decoder 10a.

The word line driver WDbi is provided corresponding to the memory cell arrays MAbi, MAa(i+1). The word line driver WDbi activates a corresponding word line Wbi1, Wbi2, Wbi3, Wbi4 in response to the row address signal RADbi from the row decoder 10b.

In response to the column address signal CADa from the frequency divider 24, the column decoder 11a applies a column address signal CADai to the column selection circuits (CRa1, CWai) of the column selection circuits (CRa1, CWa1) to (CRan, CWan) which correspond to the column address signal CADa.

In response to the column address signal CADb from the frequency divider 24, the column decoder 11b applies a column address signal CADbi to the column selection circuits (CRbi, CWbi) of the column selection circuits (CRb1, CWb1) to (CRbn, CWbn) which correspond to the column address signal CADb.

The column selection circuits CRai, CWai activate a corresponding column selection signal Rai1, Rai2, Wai1, Wai2 in response to the command signal CMD from the command decoder 21 and the column address signal CADai from the column decoder 11a. More specifically, when the command signal CMD from the command decoder 21 indicates "read operation", the column selection circuit CRai activates either the column selection signal Rai1 or Rai2 that corresponds to the column address signal CADai. When the command signal CMD from the command decoder 21 indicates "write operation", the column selection circuit CWai activates either the column selection signal Wai1 or Wai2 that corresponds to the column address signal CADai.

The column selection circuits CRbi, CWbi activate a corresponding column selection signal Rbi1, Rbi2, Wbi1, Wbi2 in response to the command signal CMD from the command decoder 21 and the column address signal CADbi from the column decoder 11b. More specifically, when the command signal CMD from the command decoder 21 indicates "read operation", the column selection circuit CRbi activates either the column selection signal Rbi1 or Rbi2 that corresponds to the column address signal CADbi. When the command signal CMD from the command decoder 21 indicates "write operation", the column selection circuit CWbi activates either the column selection signal Wbi1 or Wbi2 that corresponds to the column address signal CADbi.

The sense amplifier array SAai includes sense amplifiers 12ai, 13ai, bit line precharge circuits 18ai, 19ai and column selection switches 14ai to 17ai.

The sense amplifier 12ai is activated in response to a sense amplifier activation signal SEa and amplifies a data signal read from the memory cell MCai1, MCai2, MCbi1, MCbi2 to the bit line pair (Bai1, /Bai1). The sense amplifier 13ai is activated in response to the sense amplifier activation signal SEa and amplifies a data signal read from the memory cell MCai3, MCai4, MCbi3, MCbi4 to the bit line pair (Bai2, /Bai2).

The bit line precharge circuits 18ai, 19ai are activated in response to a precharge signal EQa and precharge the bit line pairs (Bai1, /Bai1), (Bai2, /Bai2), respectively.

The column selection switch 14ai connects and disconnects the bit line pair (Bai1, /Bai1) to and from the read data line pair RDB in response to the column selection signal Rai1 from the column selection circuit CRai. The column selection switch 15ai connects and disconnects the bit line pair (Bai2, /Bai2) to and from the read data line pair RDB in response to the column selection signal Rai2 from the column selection circuit CRai. The column selection switch 16ai connects and disconnects the bit line pair (Bai1, /Bai1) to and from the write data line pair WDB in response to the column selection signal Wai1 from the column selection circuit CWai. The column selection switch 17ai connects and disconnects the bit line pair (Bai2, /Bai2) to and from the write data line pair WDB in response to the column selection signal Wai2 from the column selection circuit CWai.

The sense amplifier array SAbi includes sense amplifiers 12bi, 13bi, bit line precharge circuits 18bi, 19bi and column selection switches 14bi to 17bi.

The sense amplifier 12bi is activated in response to a sense amplifier activation signal SEb and amplifies a data signal read from the memory cell MCbi1, MCbi2, MCa(i+1)1, MCa(i+1)2 to the bit line pair (Bbi1, /Bbi1). The sense amplifier 13bi is activated in response to the sense amplifier activation signal SEb and amplifies a data signal read from the memory cell MCbi3, MCbi4, MCa(i+1)3, MCa(i+1)4 to the bit line pair (Bbi2, /Bbi2).

The bit line precharge circuits 18bi, 19bi are activated in response to a precharge signal EQb and precharge the bit line pairs (Bbi1, /Bbi1), (Bbi2, /Bbi2), respectively.

The column selection switch 14bi connects and disconnects the bit line pair (Bbi1, /Bbi1) to and from the read data line pair RDB in response to the column selection signal Rbi1 from the column selection circuit CRbi. The column selection switch 15bi connects and disconnects the bit line pair (Bbi2, /Bbi2) to and from the read data line pair RDB in response to the column selection signal Rbi2 from the column selection circuit CRbi. The column selection switch 16bi connects and disconnects the bit line pair (Bbi1, /Bbi1) to and from the write data line pair WDB in response to the column selection signal Wbi1 from the column selection circuit CWbi. The column selection switch 17bi connects and disconnects the bit line pair (Bbi2, /Bbi2) to and from the write data line pair WDB in response to the column selection signal Wbi2 from the column selection circuit CWbi.

The data line precharge circuit 20R precharges the read data line pair RDB. The data line precharge circuit 20W precharges the write data line pair WDB.

The read amplifier 25 is provided between the read data line pair RDB and the I/O buffer 27. The read amplifier 25 is activated in response to an active enable signal RE from the control circuit 23. The read amplifier 25 amplifies a data signal from the read data line pair RDB and transfers the resultant data signal to the I/O buffer 27 in synchronization with the clock CLK.

The write driver 26 is provided between the I/O buffer 27 and the write data line pair WDB. The write driver 26 is activated in response to an active enable signal WE from the control circuit 23. The write driver 26 amplifiers a data signal from the I/O buffer 27 and transfers the resultant data signal to the write data line pair WDB in synchronization with the clock CLK.

The I/O buffer 27 outputs the data signal received from the read amplifier 25 to the outside in synchronization with the clock CLK, and outputs an external data signal to the write driver 26 in synchronization with the clock CLK.

[Read Operation]

Figure 3:
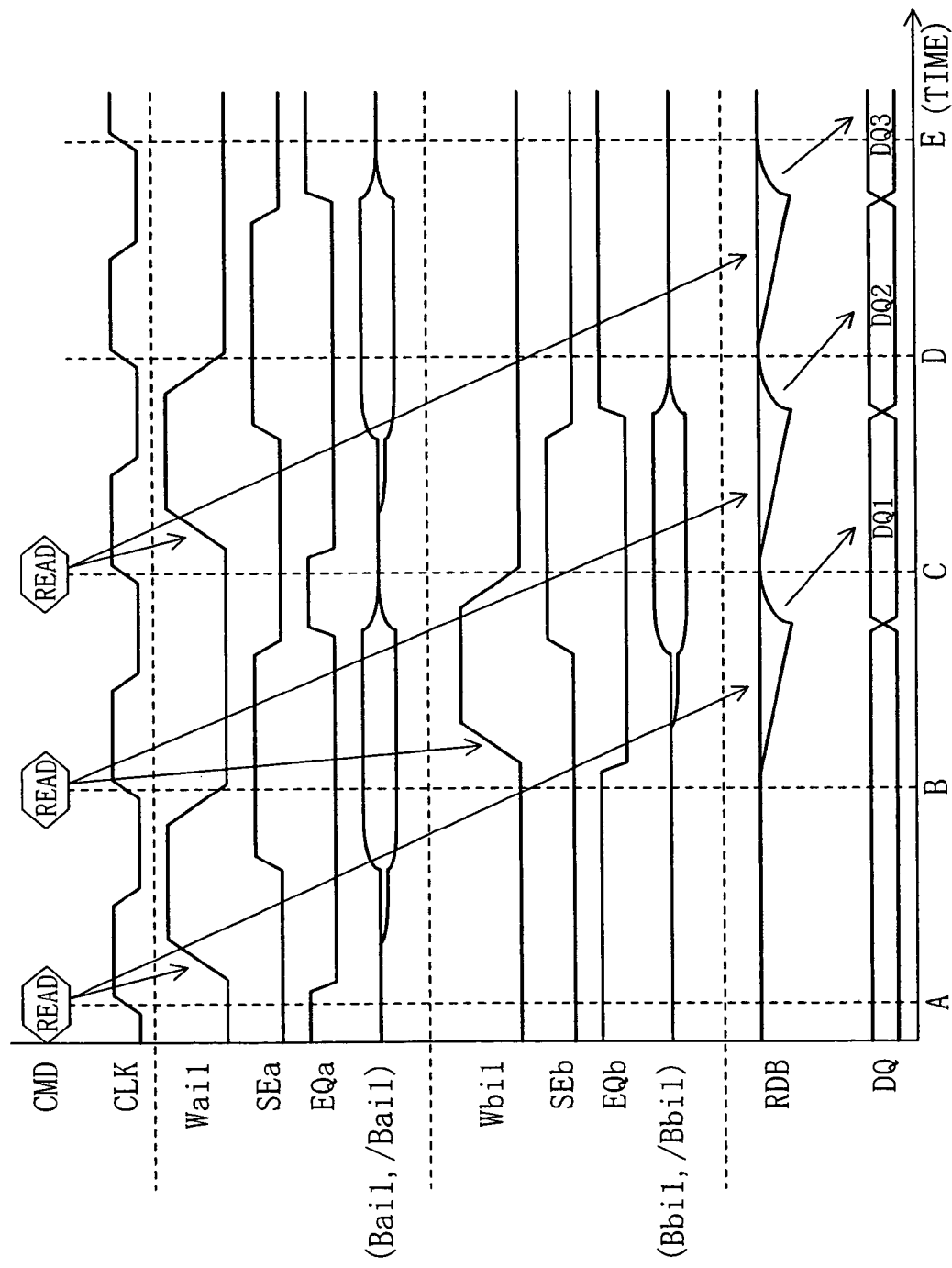
FIG. 3 is a timing chart illustrating read operation of the DRAM in FIG. 1.

Hereinafter, read operation (READ) of the above DRAM will be described with reference to FIG. 3.

As is well known in the art, in a DRAM including memory cells each having two transistors Ta, Tb and a single capacitor C like the DRAM of FIG. 1, access time can be made approximately equal to cycle time. This allows an external command to be applied to the DRAM in every cycle of the clock CLK.

At time A, a read command (READ) is applied to the command decoder 21, and an address corresponding to a memory cell to be accessed (in this example, MCai1) is applied to the address buffer 22. The command decoder 21 fetches the read command at the rising edge of the clock CLK and outputs a command signal CMD indicating "read operation". The address buffer 22 fetches the address at the rising edge of the clock CLK and outputs a row address signal RAD and a column address signal CAD corresponding to the memory cell MCai1. In response to this, the frequency divider 24 applies a row address signal RADa and a column address signal CADa corresponding to the memory cell MCai1 to the row decoder 10a and the column decoder 11a, respectively. The row decoder 10a applies a row address signal RADai corresponding to the memory cell MCai1 to the word line driver WDai. The column decoder 11a applies a column address signal CADai corresponding to the memory cell MCai1 to the column selection circuits CRai, CWai. The word line driver WDai activates the word line Wai1. As a result, the transistor Ta of the memory cell MCai1 is turned ON and data is read from the memory cell MCai1 to the bit line Bai1. The sense amplifier activation signal SEa is activated and the sense amplifier 12ai amplifies the potential difference of the bit line pair (Bai1, /Bai1).

In the period between time A and B, an active precharge signal EQb is applied to the bit line precharge circuits 18bi, 19bi to precharge the bit line pairs (Bbi1, /Bbi1), (Bbi2, /Bbi2).

At time B, the columns selection circuit CRai activates a column selection signal Rai1 corresponding to the memory cell MCai1, and the column selection switch 14ai is turned ON. As a result, the bit line pair (Bai1, /Bai1) is connected to the read data line pair RDB. An active enable signal RE is applied to the read amplifier 25. In response to this, the potential difference of the bit line pair (Bai1, /Bai1) is transferred to the read data line pair RDB, and the read amplifier 25 amplifies the potential difference for output to the I/O buffer 27. After the I/O buffer 27 receives the signal from the read amplifier 25, the enable signal RE, the column selection signal Rai1 and the sense amplifier activation signal SEa are inactivated. The data line precharge circuit 20R precharges the read data line pair RDB. An active precharge signal EQa is applied to the bit line precharge circuits 18ai, 19ai to precharge the bit line pairs (Bai1, /Bai1), (Bai2, /Bai2).

At time B, the precharge signal EQb is inactivated and the bit line precharge circuits 18bi, 19bi finish precharging the bit line pairs (Bbi1, /Bbi1), (Bbi2, /Bbi2). A read command (READ) is applied to the command decoder 21 and an address corresponding to a memory cell to be accessed (in this example, MCbi1) is applied to the address buffer 22. The command decoder 21 fetches the read command at the rising edge of the clock CLK and outputs a command signal CMD indicating "read operation". The address buffer 22 fetches the address at the rising edge of the clock CLK and outputs a row address signal RAD and a column address signal CAD corresponding to the memory cell MCbi1. In response to this, the frequency divider 24 applies a row address signal RADb and a column address signal CADb corresponding to the memory cell MCbi1 to the row decoder 10b and the column decoder 11b, respectively. The row decoder 10b applies a row address signal RADbi corresponding to the memory cell MCbi1 to the word line driver WDbi. The column decoder 11b applies a column address signal CADbi corresponding to the memory cell MCbi1 to the column selection circuits CRbi, CWbi. The word line driver WDbi activates the word line Wbi1. As a result, the transistor Tb of the memory cell MCbi1 is turned ON and data is read from the memory cell MCbi1 to the bit line Bbi1. The sense amplifier activation signal SEb is activated and the sense amplifier 12bi amplifies the potential difference of the bit line pair (Bbi1, /Bbi1).

At time C, the I/O buffer 27 outputs data DQ1 read from the memory cell MCai1 to the outside.

The column selection circuit CRbi activates the column selection signal Rbi1 corresponding to the memory cell MCbi1, and the column selection switch 14bi is turned ON. As a result, the bit line pair (Bbi1, /Bbi1) is connected to the read data line pair RDB. The control circuit 23 applies an active enable signal RE to the read amplifier 25. In response to this, the potential difference of the bit line pair (Bbi1, /Bbi1) is transferred to the read data line pair RDB. The read amplifier 25 amplifies the potential difference for output to the I/O buffer 27. After the I/O buffer 27 receives the signal from the read amplifier 25, the enable signal RE, the column selection signal Rbi1 and the sense amplifier activation signal SEb are inactivated. The data line precharge circuit 20R then precharges the read data line pair RDB. An active precharge signal EQb is applied to the bit line precharge circuits 18bi, 19bi to precharge the bit line pairs (Bbi1, /Bbi1), (Bbi2, /Bbi2).

At time C, the precharge signal EQa is inactivated and the bit line precharge circuits 18ai, 19ai finish precharging the bit line pairs (Bai1, /Bai1), (Bai2, /Bai2). A read command (READ) is applied to the command decoder 21 and an address corresponding to a memory cell to be accessed (in this example, MCai1) is applied to the address buffer 22. The command decoder 21 fetches the read command at the rising edge of the clock CLK and outputs a command signal CMD indicating "read operation". The address buffer 22 fetches the address at the rising edge of the clock CLK and outputs a row address signal RAD and a column address signal CAD corresponding to the memory cell MCai1. In response to this, the frequency divider 24 applies a row address signal RADa and a column address signal CADa corresponding to the memory cell MCai1 to the row decoder 10a and the column decoder 11a, respectively. The row decoder 10a applies a row address signal RADai corresponding to the memory cell MCai1 to the world line driver WDai. The column decoder 11a applies a column address signal CADai corresponding to the memory cell MCai1 to the column selection circuits CRai, CWai. The word line driver WDai then activates the word line Wai1. As a result, the transistor Ta of the memory cell MCai1 is turned ON and data is read from the memory cell MCai1 to the bit line Bai1. The sense amplifier activation signal SEa is activated and the sense amplifier 12ai amplifies the potential difference of the bit line pair (Bai1, /Bai1).

At time D, the I/O buffer 22 outputs data DQ2 read from the memory cell MCbi1 to the outside.

The column selection circuit CRai activates the column selection signal Rai1 corresponding to the memory cell MCai1 and the column selection switch 14ai is turned ON. As a result, the bit line pair (Bai1, /Bai1) is connected to the read data line pair RDB. The control circuit 23 applies an active enable signal RE to the read amplifier 25. In response to this, the potential difference of the bit line pair (Bai1, /Bai1) is transferred to the read data line pair RDB. The read amplifier 25 amplifies the potential difference for output to the I/O buffer 27. After the I/O buffer 27 receives the signal from the read amplifier 25, the enable signal RE, the column selection signal Rai1 and the sense amplifier activation signal SEa are inactivated. The data line precharge circuit 20R then precharges the read data line pair RDB. An active precharge signal EQa is applied to the bit line precharge circuits 18ai, 19ai to precharge the bit line pairs (Bai1, /Bai1), (Bai2, /Bai2).

At time E, the I/O buffer 27 outputs data DQ3 read from the memory cell MCai1 to the outside.

As has been described above, in the DRAM of FIG. 1, the following two ports A, B interleave with each other in two cycles of the clock CLK: the port A formed by a path including the transistor Ta of a memory cell to be accessed, the bit line pair (Bai1, /Bai1), (Bai2, /Bai2) corresponding to that transistor Ta, the column selection switch 14ai, 15ai corresponding to that bit line pair, and the read data line pair RDB; and the port B formed by a path including the transistor Tb of a memory cell to be accessed, the bit line pair (Bbi1, /Bbi1), (Bbi2, /Bbi2) corresponding to that transistor Tb, the column selection switch 14bi, 15bi corresponding to that bit line pair, and the read data line pair RDB. The read amplifier 25 amplifies the data transferred from the bit line pair to the read data line pair RDB and outputs the resultant data to the I/O buffer 27 in one cycle of the clock CLK. The I/O buffer 27 outputs the data received from the read amplifier 27 to the outside in one cycle of the clock CLK. In other words, the read amplifier 25 and the I/O buffer 27 do not conduct interleave operation. Such interleave operation of the two internal ports apparently hides precharge operation of the bit lines, thereby reducing the cycle time to approximately the same length as that of the access time.

Although read operation has been described in detail, write operation is conducted similarly. In write operation, the I/O buffer 27 transfers external data to the write driver 26 in one cycle of the clock CLK. The write driver 26 amplifies the data received from the I/O buffer 27 and transfers the resultant data to the write data line pair WDB in one cycle of the clock CLK. In other words, the I/O buffer 27 and the write driver 26 do not conduct interleave operation. The following two ports A, B interleave with each other in two cycles of the clock CLK: the port A formed by a path including the transistor Ta of a memory cell to be accessed, the bit line pair (Bai1, /Bai1), (Bai2, /Bai2) corresponding to that transistor Ta, the column selection switch 16ai, 17ai corresponding to that bit line pair, and the write data line pair WDB; and the port B formed by a path including the transistor Tb of a memory cell to be accessed, the bit line pair (Bbi1, /Bbi1), (Bbi2, /Bbi2) corresponding to that transistor Tb, the column selection switch 16bi, 17bi corresponding to that bit line pair, and the write data line pair WDB.

In the DRAM of the first embodiment, a common read amplifier 25 and a common write driver 26 are provided for the ports A, B. This enables reduction in circuit layout area as compared to the case where separate read amplifiers and write drivers are provided for the ports A, B.

Moreover, the DRAM of the first embodiment includes the read data line pair RDB for transferring read data from the memory cell to the read amplifier 25 and the write data line pair WDB for transferring write data from the write driver 26 to the memory cell. Therefore, the data line pair RDB need only be controlled for read operation and the data line pair WDB need only be controlled for write operation. This facilitates control of the data line pairs RDB, WDB and timing design as compared to the case where a single data line pair is controlled for both read and writ operations.

The above DRAM is a synchronous DRAM. However, the same effects can be obtained even when an asynchronous DRAM is used.

Although the complementary data line pairs RDB, WDB are used herein, single-type data lines may alternatively be used. This eliminates the need to consider precharge operation of the data lines, enabling high-sepped design.

(Second Embodiment)

[Overall Structure of the DRAM]

Figure 4:
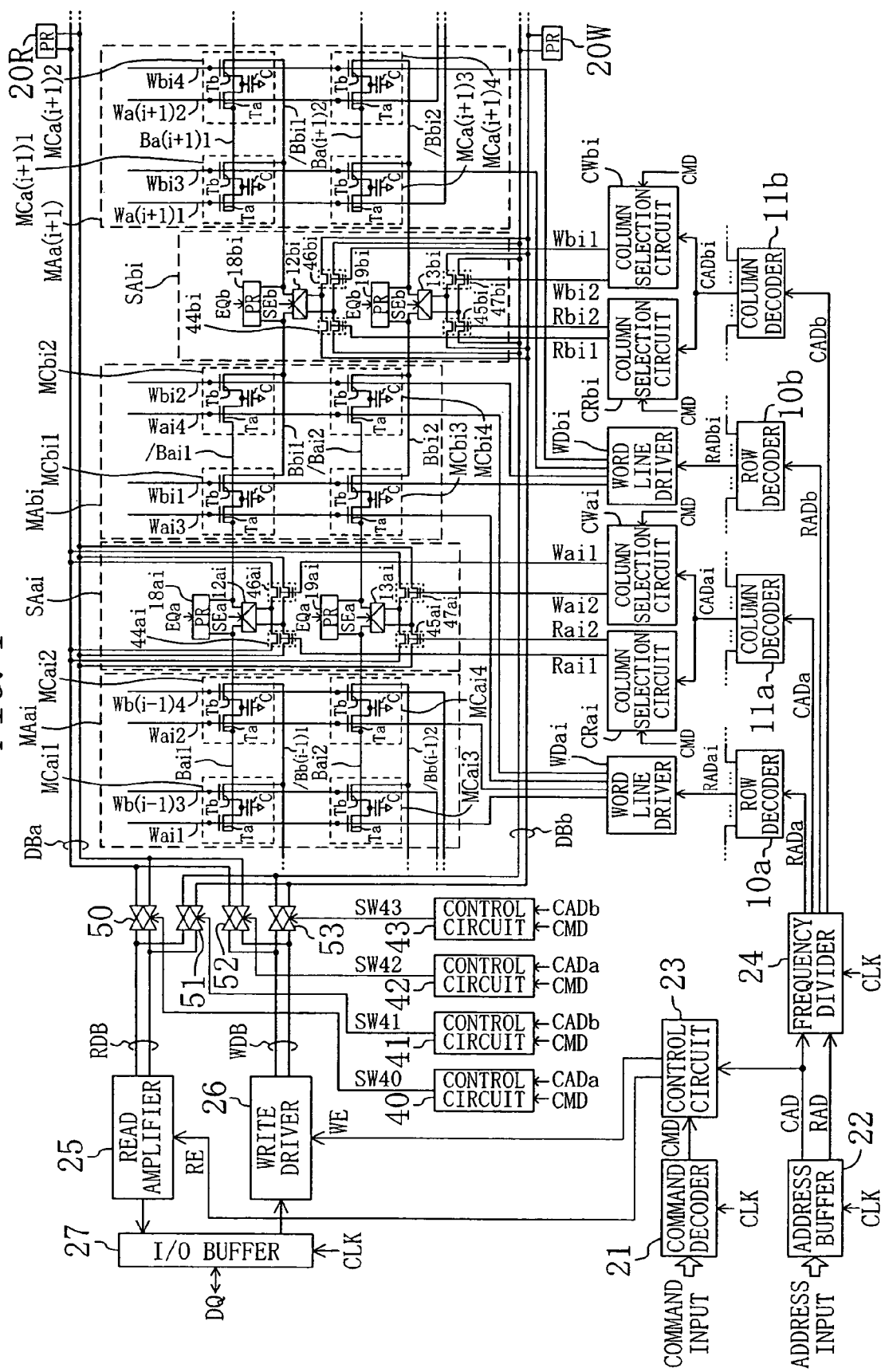
FIG. 4 is a block diagram showing the overall structure of a DRAM according to a second embodiment of the present invention.

FIG. 4 is a block diagram showing the overall structure of the DRAM according to the second embodiment of the present invention. The DRAM of FIG. 4 is a synchronous DRAM operating in synchronization with a clock CLK. This DRAM includes memory cell arrays MAai, MAbi (where i is in the range of 1 to n, and n is a positive integer), sense amplifier arrays SAai, SAbi (where i is in the range of 1 to n, and n is a positive integer), row decoders 10a, 10b, column decoders 11a, 11b, word line drivers WDai, WDbi (where i is in the range of 1 to n, and n is a positive integer), column selection circuits CRai, CWai, CRbi, CWbi (where i is in the range of 1 to n, and n is a positive integer), data line pairs DBa, DBb, RDB, WDB, control circuits 23, 40, 41, 42 43, transfer gates 50 to 53, data line precharge circuits 20R, 20W, a command decoder 21, an address buffer 22, a frequency divider 24, a read amplifier 25, a write driver 26, and an I/O buffer 27.

The memory cell arrays and the sense amplifier arrays are arranged in the column direction in the following order: memory cell array MAa1, sense amplifier array SAa1, memory cell array MAb1, sense amplifier array SAb1, memory cell array MAa2, . . . Note that, for simplicity of description, FIG. 4 shows only the memory cell arrays MAai, MAbi, MAa(i+1) and the sense amplifiers SAai, SAbi, the word line drivers WDai, WDbi, column selection circuits CRai, CWai, CRbi, CWbi.

The sense amplifier array SAai includes sense amplifiers 12ai, 13ai, bit line precharge circuits 18ai, 19ai, and column selection switches 44ai to 47ai.

The column selection switches 44ai, 45ai connect and disconnect the bit line pairs (Bai1, /Bai1), (Bai2, /Bai2) to and from the data line pair DBa in response to column selection signals Rai1, Rai2 from the column selection circuit CRai, respectively.

The column selection switches 46ai, 47ai connect and disconnect the bit line pairs (Bai1, /Bai1), (Bai2, /Bai2) to and from the data line pair DBa in response to column selection signals Wai1, Wai2 from the column selection circuit CWai.

The sense amplifier array SAbi includes sense amplifiers 12bi, 13bi, bit line precharge circuits 18bi, 19bi, and column selection switches 44bi to 47bi.

The column selection switches 44bi, 45bi connect and disconnect the bit line pairs (Bbi1, /Bbi1), (Bbi2, /Bbi2) to and from the data line pair DBb in response to column selection signals Rbi1, Rbi2 from the column selection circuit CRbi, respectively.

The column selection switches 46bi, 47bi connect and disconnect the bit line pairs (Bbi1, /Bbi1), (Bbi2, /Bbi2) to and from the data line pair DBb in response to column selection signals Wbi1, Wbi2 from the column selection circuit CWbi.

The control circuits 40 to 43 respectively output switch signals SW40 to SW43 in response to a command signal CMD from the command decoder 21 and column address signals CADa, CADb from the frequency divider 24. More specifically, when the command signal CMD indicates "read operation", the control circuit 40 outputs an active switch signal SW40 for a predetermined period (a period within one cycle of the clock CLK) in response to switching of the column address signal CADa. Otherwise, the control circuit 40 outputs an inactive switch signal SW40. When the command signal CMD indicates "read operation", the control circuit 41 outputs an active switch signal SW41 for a predetermined period (a period within one cycle of the clock CLK) in response to switching of the column address signal CADb. Otherwise, the control circuit 41 outputs an inactive switch signal SW41. When the command signal CMD indicates "write operation", the control circuit 42 outputs an active switch signal SW42 for a predetermined period (a period within one cycle of the clock CLK) in response to switching of the column address signal CADa. Otherwise, the control circuit 42 outputs an inactive switch signal SW42. When the command signal CMD indicates "write operation", the control circuit 43 outputs an active switch signal SW43 for a predetermined period (a period within one cycle of the clock CLK) in response to switching of the column address signal CADb. Otherwise, the control circuit 43 outputs an inactive switch signal SW43.

The transfer gate 50 connects the data line pair DBa to the data line pair RDB in response to the active switch signal SW40 from the control circuit 40, and disconnects the data line pair DBa from the data line pair RDB in response to the inactive switch signal SW40 from the control circuit 40. The transfer gate 51 connects the data line pair DBb to the data line pair RDB in response to the active switch signal SW41 from the control circuit 41, and disconnects the data line pair DBb from the data line pair RDB in response to the inactive switch signal SW41 from the control circuit 41. The transfer gate 52 connects the data line pair DBa to the data line pair WDB in response to the active switch signal SW42 from the control circuit 42, and disconnects the data line pair DBa from the data line pair WDB in response to the inactive switch signal SW42 from the control circuit 42. The transfer gate 53 connects the data line pair DBb to the data line pair WDB in response to the active switch signal SW43 from the control circuit 43, and disconnects the data line pair DBb from the data line pair WDB in response to the inactive switch signal SW43 from the control circuit 43.

The data line pairs DBa, DBb are provided on the memory cell arrays MAai, MAbi, and the data line pairs RDB, WDB are provided on peripheral circuitry.

[Read Operation]

Figure 5:
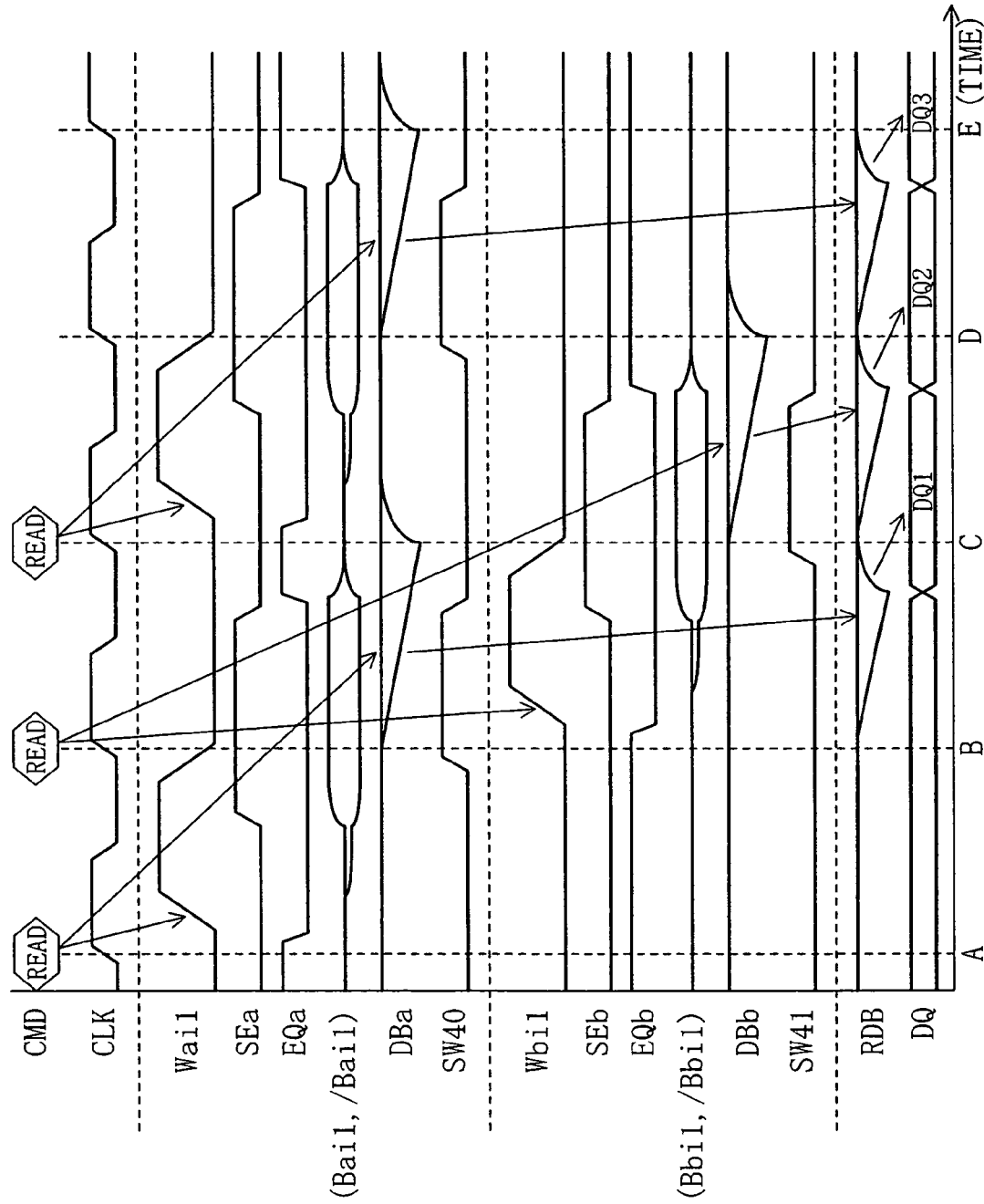
FIG. 5 is a timing chart illustrating read operation of the DRAM in FIG. 4.

Hereinafter, read operation (READ) of the above DRAM will be described with reference to FIG. 5.

At time A, a read command (READ) is applied to the command decoder 21, and an address corresponding to a memory cell to be accessed (in this example, MCai1) is applied to the address buffer 22. The command decoder 21 fetches the read command at the rising edge of the clock CLK and outputs a command signal CMD indicating "read operation". The address buffer 22 fetches the address at the rising edge of the clock CLK and outputs a row address signal RAD and a column address signal CAD corresponding to the memory cell MCai1. In response to this, the frequency divider 24 applies a row address signal RADa and a column address signal CADa corresponding to the memory cell MCai1 to the row decoder 10a and the column decoder 11a, respectively. The row decoder 10a applies a row address signal RADai corresponding to the memory cell MCai1 to the word line driver WDai. The column decoder 11a applies a column address signal CADai corresponding to the memory cell MCai1 to the column selection circuits CRai, CWai. The word line driver WDai then activates the word line Wai1. As a result, the transistor Ta of the memory cell MCai1 is turned ON and data is read from the memory cell MCai1 to the bit line Bai1. The sense amplifier activation signal SEa is activated and the sense amplifier 12ai amplifies the potential difference of the bit line pair (Bai1, /Bai1).

In the period between time A and B, an active precharge signal EQb is applied to the bit line precharge circuits 18bi, 19bi to precharge the bit line pairs (Bbi1, /Bbi1), (Bbi2, /Bbi2).

At time B, the column selection circuit CRai activates a column selection signal Rai1 corresponding to the memory cell MCai1, and the column selection switch 44ai is turned ON. As a result, the bit line pair (Bai1, /Bai1) is connected to the data line pair DBa. An active switch signal SW40 is applied to the transfer gate 50, whereby the data line pair DBa is connected to the data line pair RDB. Moreover, an active enable signal RE is applied to the read amplifier 25. As a result, the potential difference transferred from the bit line pair (Bai1, /Bai1) to the data line pairs DBa, RDB is amplified by the read amplifier 25 for output to the I/O buffer 27. After the I/O buffer 27 receives the signal from the read amplifier 25, the switch signal SW40 is inactivated, whereby the data line pair DBa is disconnected from the data line pair RDB and the data line pair RDB is precharged. The enable signal RE, the column selection signal Rai1 and the sense amplifier activation signal SEa are inactivated. An active precharge signal EQa is applied to the bit line precharge circuits 18ai, 19ai to precharge the bit line pairs (Bai1, /Bai1), (Bai2, /Bai2).

At time B, the precharge signal EQb is inactivated and the bit line precharge circuits 18bi, 19bi finish precharging the bit line pairs (Bbi1, /Bbi1), (Bbi2, /Bbi2). A read command (READ) is applied to the command decoder 21 and an address corresponding to a memory cell to be accessed (in this example, MCbi1) is applied to the address buffer 22. The command decoder 21 fetches the read command at the rising edge of the clock CLK and outputs a command signal CMD indicating "read operation". The address buffer 22 fetches the address at the rising edge of the clock CLK and outputs a row address signal RAD and a column address signal CAD corresponding to the memory cell MCbi1. In response to this, the frequency divider 24 applies a row address signal RADb and a column address signal CADb corresponding to the memory cell MCbi1 to the row decoder 10b and the column decoder 11b, respectively. The row decoder 10b applies a row address signal RADbi corresponding to the memory cell MCbi1 to the word line driver WDbi. The column decoder 11b applies a column address signal CADbi corresponding to the memory cell MCbi1 to the column selection circuits CRbi, CWbi. The word line driver WDbi activates the word line Wbi1. As a result, the transistor Tb of the memory cell MCbi1 is turned ON and data is read from the memory cell MCbi1 to the bit line Bbi1. The sense amplifier activation signal SEb is then activated and the sense amplifier 12bi amplifies the potential difference of the bit line pair (Bbi1, /Bbi1).

At time C, the I/O buffer 27 outputs data DQ1 read from the memory cell MCai1 to the outside.

The data line precharge circuit 20R is activated and precharges the data line pair DBa by time D.

The column selection circuit CRbi activates the column selection signal Rbi1 corresponding to the memory cell MCbi1, and the column selection switch 44bi is turned ON. As a result, the bit line pair (Bbi1, /Bbi1) is connected to the data line pair DBb. An active switch signal SW41 is applied to the transfer gate 51, whereby the data line DBb is connected to the data line pair RDB. An active enable signal RE is applied to the read amplifier 25. As a result, the potential difference of the bit line pair (Bbi1, /Bbi1) is transferred to the data line pairs DBb, RDB. The read amplifier 25 then amplifies the potential difference for output to the I/O buffer 27. After the I/O buffer 27 receives the signal from the read amplifier 25, the switch signal SW41 is inactivated, whereby the data line pair DBb is disconnected from the data line pair RDB and the data line pair RDB is precharged. The enable signal RE, the column selection signal Rbi1, and the sense amplifier activation signal SEb are inactivated. An active precharge signal EQb is applied to the bit line precharge circuits 18*bi*, 19*bi* to precharge the bit line pairs (Bbi1, /Bbi1), (Bbi2, /Bbi2).

At time C, the precharge signal EQa is inactivated and the bit line precharge circuits 18*ai*, 19*ai* finish precharging the bit line pairs (Bai1, /Bai1), (Bai2, /Bai2). A read command (READ) is applied to the command decoder 21, and an address corresponding to a memory cell to be accessed (in this example, MCai1) is applied to the address buffer 22. The command decoder 21 fetches the read command at the rising edge of the clock CLK and outputs a command signal CMD indicating "read operation". The address buffer 22 fetches the address at the rising edge of the clock CLK and outputs a row address signal RAD and a column address signal CAD corresponding to the memory cell MCai1. In response to this, the frequency divider 24 applies a row address signal RADa and a column address signal CADa corresponding to the memory cell MCai1 to the row decoder 10*a* and the column decoder 11*a*, respectively. The row decoder 10*a* applies a row address signal RADai corresponding to the memory cell MCai1 to the word line driver WDai. The column decoder 11*a* applies a column address signal CADai corresponding to the memory cell MCai1 to the column selection circuits CRai, CWai. The word line driver WDai activates the word line Wai1. As a result, the transistor Ta of the memory cell MCai1 is turned ON and data is read from the memory cell MCai1 to the bit line Bai1. The sense amplifier activation signal SEa is activated and the sense amplifier 12*ai* amplifies the potential difference of the bit line pair (Bai1, /Bai1).

At time D, the I/O buffer 27 outputs data DQ2 read from the memory cell MCbi1 to the outside.

The data line precharge circuit 20W is activated and precharges the data line pair DBb by time E.

The column selection circuit CRai activates a column selection signal Rai1 corresponding to the memory cell MCai1, whereby the column selection switch 44*ai* is turned ON. As a result, the bit line pair (Bai1, /Bai1) is connected to the data line pair DBa. An active switch signal SW40 is applied to the transfer gate 50, whereby the data line pair DBa is connected to the data line pair RDB. An active enable signal RE is applied to the read amplifier 25. As a result, the potential difference of the bit line pair (Bai1, /Bai1) is transferred to the data line pairs DBa, RDB. The read amplifier 25 amplifies the potential difference for output to the I/O buffer 27. After the I/O buffer 27 receives the signal from the read amplifier 25, the switch signal SW40 is inactivated, whereby the data line pair DBa is disconnected from the data line pair RDB and the data line pair RDB is precharged. The enable signal RE, the column selection signal Rai1 and the sense amplifier activation signal SEa are inactivated. An active precharge signal EQa is applied to the bit line precharge circuits 18*ai*, 19*ai* to precharge the bit line pairs (Bai1, /Bai1), (Bai2, /Bai2).

At time E, the I/O buffer 27 outputs data DQ3 read from the memory cell MCai1 to the outside. The data line precharge circuit 20R is activated and precharges the data line pair DBa.

As has been described above, in the DRAM of FIG. 4, the following two ports A, B interleave with each other in two cycles of the clock CLK: the port A formed by a path including the transistor Ta of a memory cell to be accessed, the bit line pair (Bai1, /Bai1), (Bai2, /Bai2) corresponding to that transistor Ta, the column selection switch 14*ai*, 15*ai* corresponding to that bit line pair, and the data line pair DBa; and the port B formed by a path including the transistor Tb of a memory cell to be accessed, the bit line pair (Bbi1, /Bbi1), (Bbi2, /Bbi2) corresponding to that transistor Tb, the column selection switch 14*bi*, 15*bi* corresponding to that bit line pair, and the data line pair DBb. The data transferred to the data line pairs DBa, DBb are alternately transferred to the data line pair RDB in every cycle of the clock CLK through the transfer gates 50, 51. The read amplifier 25 amplifies the data transferred to the data line pair RDB and outputs the resultant data to the I/O buffer 27 in one cycle of the clock CLK. The I/O buffer 27 outputs the data received from the read amplifier 27 to the outside in one cycle of the clock CLK.

Although read operation has been described in detail, write operation is conducted similarly. In write operation, the I/O buffer 27 transfers external data to the write driver 26 in one cycle of the clock CLK. The write driver 26 amplifies the data received from the I/O buffer 27 and transfers the resultant data to the data line pair WDB in one cycle of the clock CLK. The data transferred to the data line pair WDB is alternately transferred to the data line pairs DBa, DBb in every cycle of the clock CLK through the transfer gates 52, 53. In write operation as well, the following two ports A, B interleave with each other in two cycles of the clock CLK: the port A formed by a path including the transistor Ta of a memory cell to be accessed, the bit line pair (Bai1, /Bai1), (Bai2, /Bai2) corresponding to that transistor Ta, the column selection switch 16*ai*, 17*ai* corresponding to that bit line pair, and the data line pair DBa; and the port B formed by a path including the transistor Tb of a memory cell to be accessed, the bit line pair (Bbi1, /Bbi1), (Bbi2, /Bbi2) corresponding to that transistor Tb, the column selection switch 16*bi*, 17*bi* corresponding to that bit line pair, and the data line pair DBb.

As has been described above, the DRAM of the second embodiment includes the transfer gates 50 to 53 and the control circuits 40 to 43. Therefore, separate read amplifiers and write drivers need not be provided for the ports A, B. In other words, a common read amplifier 25 and a common write driver 26 need only be provided for the ports A, B. This enables reduction in circuit layout area as compared to the case where separate read amplifiers and write drivers are provided for the ports A, B.

Moreover, data transfer operation and precharge operation of the data line pairs DBa, DBb are conducted in two cycles of the clock CLK. While the data line pair DBb is being precharged, data is transferred between the data line pair DBa and the data line pair RDB, WDB. While the data line pair DBa is being precharged, data is transferred between the data line pair DBb and the data line pair RDB, WDB. This apparently hides precharge operation of the data line pairs DBa, DBb.

Moreover, data transfer operation and precharge operation of the data line pairs provided on the memory cell arrays and subjected to relatively large load, that is, the data line pairs DBa, DBb, are conducted in a cycle twice the cycle of the clock CLK. Data transfer operation and precharge operation of the data line pairs provided on the peripheral circuitry and subjected to relatively small load, that is, the data line pairs RDB, WDB, are conducted in one cycle of the clock CLK. This enables the margin of the data transfer operation to be improved over that of the DRAM of FIG. 1.

(Third Embodiment)

[Overall Structure]

Figure 6:
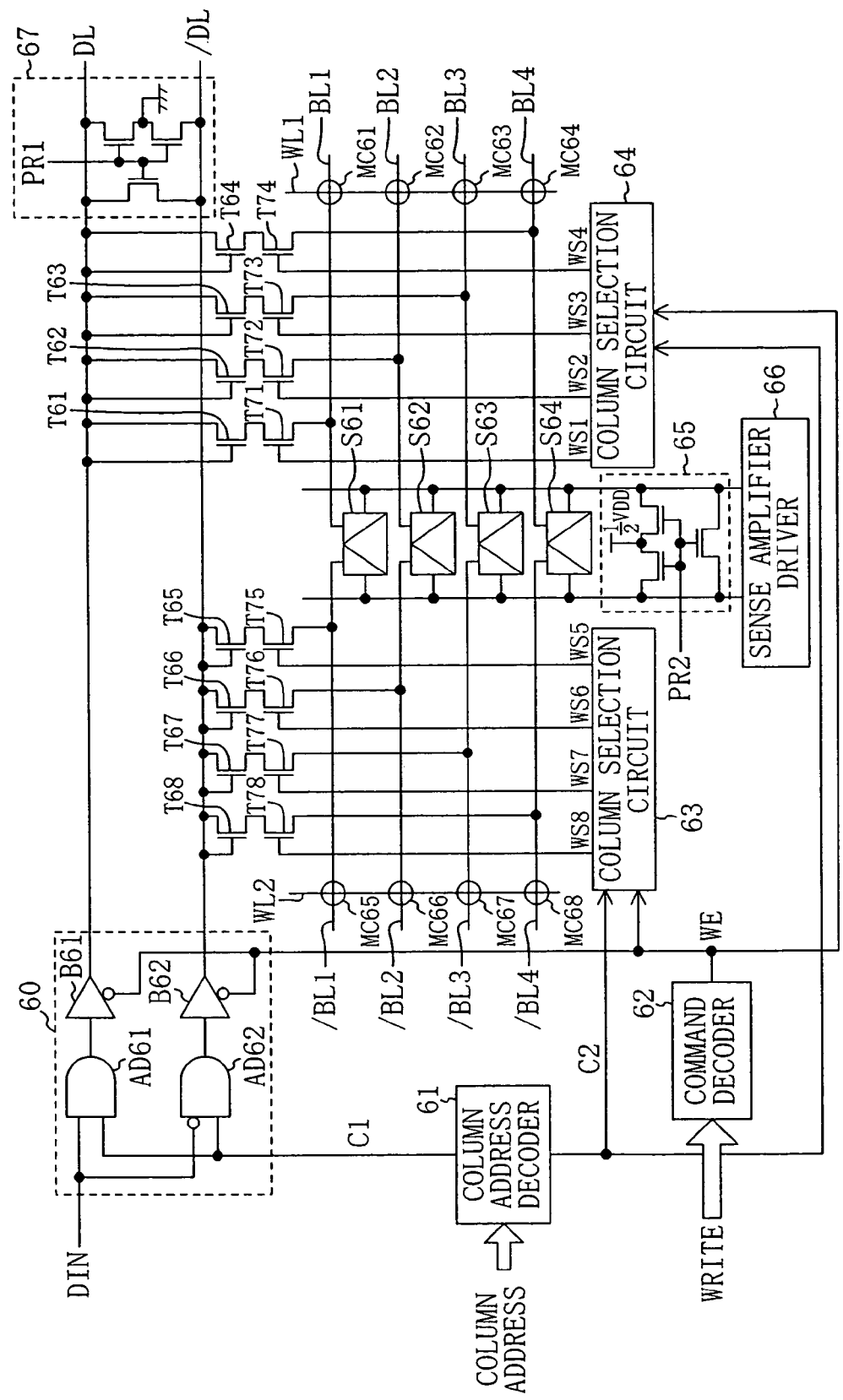
FIGS. 6 and 7 are block diagrams showing the overall structure of a DRAM according to third and fourth embodiments of the present invention, respectively.

FIG. 6 is a block diagram showing the overall structure of the DRAM according to the third embodiment of the present invention. The DRAM of FIG. 6 includes memory cells MC61 to MC68, word lines WL1, WL2, bit lines BL1 to BL4, /BL1 to /BL4, sense amplifiers S61 to S64, N-channel MOS (Metal Oxide Semiconductor) transistors T61 to T68, T71 to T78, a write driver 60, a column address decoder 61, a command decoder 62, column selection circuits 63, 64, a bit line precharge circuit 65, a sense amplifier driver 66, a data line pair (DL, /DL), and a data-line precharge circuit 67.

The memory cells MC61 to MC68 are arranged in rows and columns. The word lines WL1, WL2 are arranged in rows. The word line WL1 is provided corresponding to the memory cells MC61 to MC64. The word line WL2 is provided corresponding to the memory cells MC65 to MC68. The bit lines BL1 to BL4, /BL1 to /BL4 are arranged in columns. The bit lines BL1 to BL4 are provided corresponding to the memory cells MC61 to MC64. The bit lines /BL1 to /BL4 are provided corresponding to the memory cells MC65 to MC68.

The N-channel MOS transistors T61 to T64 are connected between the data line DL and the N-channel MOS transistors T71 to T74, respectively, and receive the voltage on the data line DL at their gates. The N-channel MOS transistors T71 to T74 are connected between the N-channel MOS transistors T61 to T64 and the bit lines BL1 to BL4 and turned ON/OFF in response to column selection signals WS1 to WS4 from the column selection circuit 64, respectively.

The N-channel MOS transistors T65 to T68 are connected between the data line /DL and the N-channel MOS transistors T75 to T78, respectively, and receive the voltage on the data line /DL at their gates. The N-channel MOS transistors T75 to T78 are connected between the N-channel MOS transistors T65 to T68 and the bit lines /BL1 to /BL4 and turned ON/OFF in response to column selection signals WS5 to WS8 from the column selection circuit 63.

The column address decoder 61 outputs column address signals C1, C2 in response to a column address. The command decoder 62 outputs an active enable signal WE in response to a write command (WRITE).

The column selection circuit 63 is activated in response to the active enable signal WE from the command decoder 62 and activates one of the column selection signals WS5 to WS8 which corresponds to the column address signal C2 from the column address decoder 61.

The column selection circuit 64 is activated in response to the active enable signal WE from the command decoder 62 and activates one of the column selection signals WS1 to WS4 which corresponds to the column address signal C2 from the column address decoder 61.

The write driver 60 includes AND circuits AD61, AD62 and tri-state buffers B61, B62. The AND circuit AD61 outputs the AND operation result of write data DIN and the column address signal C1 from the column address decoder 61. The AND circuit 62 outputs the AND operation result of inverted data /DIN of the write data and the column address signal C1 from the column address decoder 61. The tri-state buffers B61, B62 are activated in response to the enable signal WE from the command decoder 62 and drive the data lines DL, /DL according to the output of the AND circuits AD61, AD62, respectively.

The data-line precharge circuit 67 precharges the data line pair (DL, /DL) to the ground voltage level in response to a precharge signal PR1. The bit-line precharge circuit 65 precharges the bit lines BL1 to BL4, /BL1 to /BL4 to the ½ VDD level (where VDD is a power supply voltage) in response to a precharge signal PR2. The sense amplifier driver 66 activates the sense amplifiers S61 to S64 in response to a sense amplifier activation signal (not shown). The sense amplifiers S61 to S64 amplify the potential difference of the bit line pairs (BL1, /BL1) to (BL1, /BL4), respectively.

[Write Operation]

Hereinafter, write operation of the above DRAM will be described. It is herein assumed that H-level data is to be written to the memory cell MC61.

First, the data line pair (DL, /DL) is precharged to the ground voltage (VSS) level. The bit line pairs (BL1, /BL1) to (BL4, /BL4) are precharged to the ½ VDD level. A write command (WRITE) is applied to the command decoder 62. The command decoder 62 outputs an active enable signal WE in response to the write command. The word line WL1 corresponding to the memory cell MC61 to be written is activated. A column address signal corresponding to the memory cell MC61 is applied to the column address decoder 61. The column address decoder 61 outputs an active column address signal C1 to the AND circuits AD61, AD62 in response to the column address signal. The column address decoder 61 also outputs a column address signal C2 corresponding to the memory cell to be accessed to the column selection circuits 63, 64.

Write data DIN is applied to the AND circuits AD61, AD62. The output of either the AND circuit AD61 or AD62 is activated according to the value of the write data DIN. It is herein assumed that the output of the AND circuit AD61 is activated. The tri-state buffer B61 receives the activated output and activates the data line DL. The data line DL is thus raised to the power supply voltage (VDD) level. The other data line /DL is retained at the ground voltage level.

Since the data line DL is raised to the power supply voltage (VDD) level, the N-channel MOS transistors T61 to T64 are turned ON. In response to the column address signal C2 from the column address decoder 61, the column selection circuits 63, 64 activate the column selection signals WS1 to WS4, WS5 to WS8 that correspond to the bit line pair corresponding to the memory cell to be accessed. It is herein assumed that the column selection circuits 63, 64 activate the column selection signals WS1, WS5, respectively. As a result, the N-channel MOS transistors T71, T75 are turned ON. In response to this, the bit line BL1 precharged to the ½ VDD level reaches the level (VDD–Vtn), that is, the power supply voltage (VDD) level minus a threshold voltage Vtn of the N-channel MOS transistors T61, T71. On the other hand, since the N-channel MOS transistor T65 is OFF, the bit line /BL1 is retained at the ½ VDD level.

The sense amplifier driver 66 then activates the sense amplifier S61. The sense amplifier S61 amplifies the potential difference of the bit line pair (BL1, /BL1) and H-level data is written to the memory cell MC61.

As has been described above, in the DRAM of the third embodiment, the write driver 60 activates either the data line DL or /DL based on the write data DIN and the column address signal C1 corresponding to the memory cell to be written. In order to write the data from the data lines DL, /DL to the bit lines BL1 to BL4, /BL1 to /BL4, the N-channel MOS transistors T61 to T68 are turned ON/OFF by the voltages on the data lines DL, /DL. As a result, signal lines for turning ON/OFF the N-channel MOS transistors T61 to T68 need not be provided in the column direction. This enables significant reduction in layout area of wiring layers.

Moreover, power supply lines can be provided instead of the signal lines for turning ON/OFF the N-channel MOS transistors T61 to T68. This not only reinforces the power supply but also improves the shielding effect of the data lines DL, /DL.

Note that the same effects can be obtained by replacing the N-channel MOS transistors T61 to T68 with P-channel MOS transistors. In this case, however, the data line pair (DL, /DL) must be precharged to the power supply voltage level rather than the ground voltage level.

Alternatively, the N-channel MOS transistors T61 to T68 may be replaced with CMOS (Complementary Metal Oxide Semiconductor) transistors. This allows the data to be written to both a higher voltage side and a lower voltage side, enabling further improvement in write level.

The voltage on the data line DL may be applied to the gates of the N-channel MOS transistors T65 to T68 and the voltage on the data line /DL may be applied to the gates of the N-channel MOS transistors T61 to T64. This prevents the write level to a bit line from falling to the power supply voltage minus the threshold voltage of the transistors. This effect is obtained even when the N-channel MOS transistors T61 to T68 are replaced with P-channel MOS transistors or CMOS transistors.

The technique of the present embodiment is also applicable to the DRAMs of FIGS. 1 and 4.

(Fourth Embodiment)
[Overall Structure]

Figure 7:
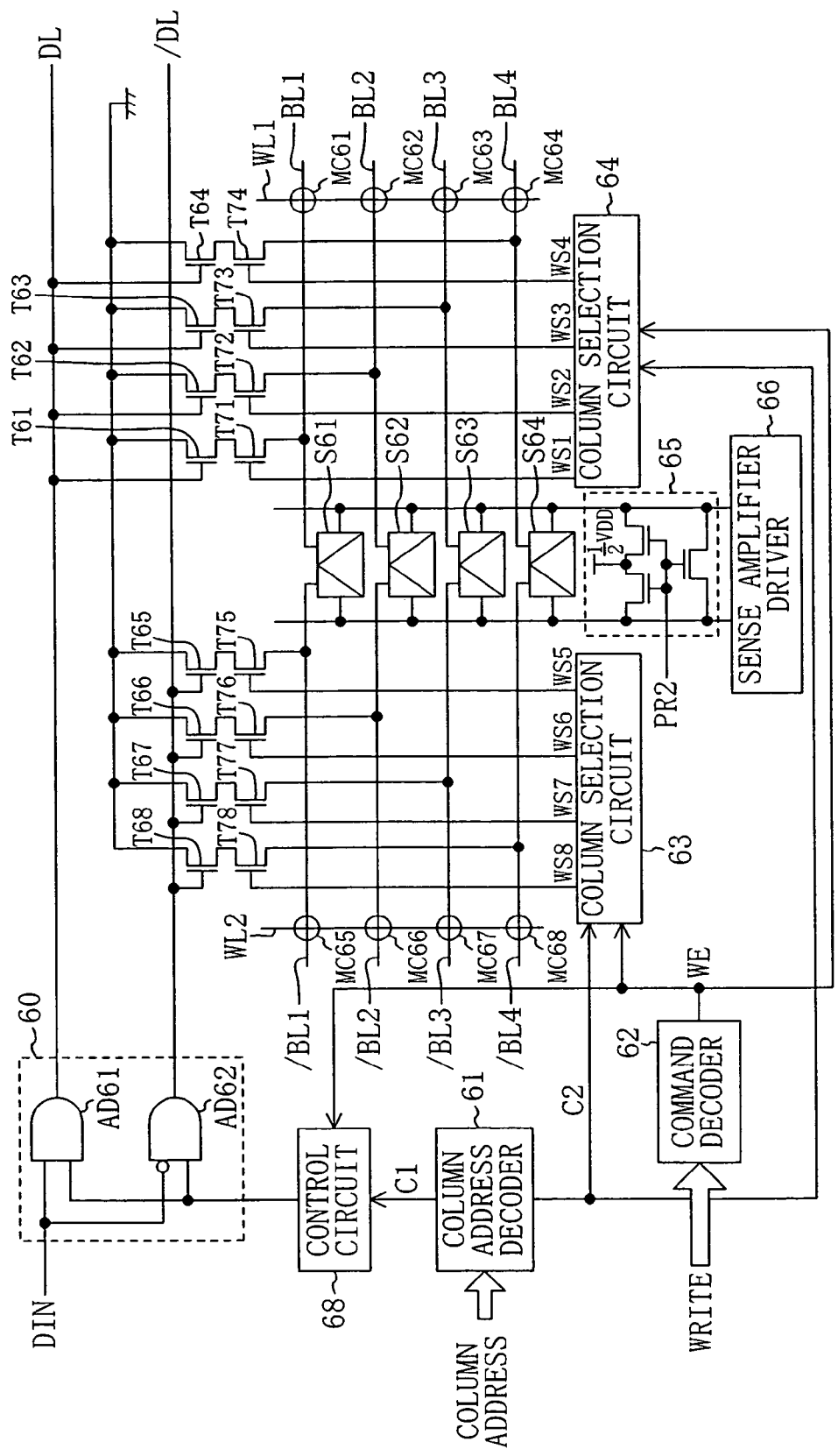

FIG. 7 is a block diagram showing the overall structure of the DRAM according to the fourth embodiment of the present invention. The DRAM of FIG. 7 is different from the DRAM of FIG. 6 in the following points: the DRAM of FIG. 7 does not include the data-line precharge circuit 67 in FIG. 6; the write driver 60 does not include the tri-state buffers B61, B62 in FIG. 6; the N-channel MOS transistors T61 to T68 are connected between a ground node receiving a ground voltage and the N-channel MOS transistors T71 to T78, respectively; and the DRAM of FIG. 7 further includes a control circuit 68. The control circuit 68 is activated in response to an enable signal WE from the command decoder 62 and applies an active signal to the inputs of the AND circuits AD61, AD62 according to a column address signal C1 from the column address decoder 61. The AND circuit AD61 outputs the AND operation result of the write data DIN and the signal from the control circuit 68. The AND circuit AD62 outputs the AND operation result of inverted data of write data DIN and the signal from the control circuit 68. The DRAM of FIG. 7 is otherwise the same as the DRAM of FIG. 6.

[Write Operation]

Hereinafter, write operation of the above DRAM will be described. It is herein assumed that L-level data is to be written to the memory cell MC61.

A write command (WRITE) is applied to the command decoder 62. The command decoder 62 outputs an active enable signal WE in response to the write command. The word line WL1 corresponding to the memory cell MC61 to be written is activated. A column address signal corresponding to the memory cell MC61 is applied to the column address decoder 61. The column address decoder 61 outputs an active column address signal C1 to the control circuit 68 in response to the column address signal. In response to this, the control circuit 68 outputs an active signal to the inputs of the AND circuits AD61, AD62. The column address decoder 61 also outputs a column address signal C2 corresponding to the memory cell to be accessed to the column selection circuits 63, 64.

Write data DIN is applied to the AND circuits AD61, AD62. The output of either the AND circuit AD61 or AD62 is activated according to the value of the write data DIN. In other words, either the data line DL or /DL is activated. It is herein assumed that the output of the AND circuit AD61, that is, the data line DL, is activated. The activated data line DL is raised to the power supply potential (VDD) level.

Since the data line DL is raised to the power supply voltage (VDD) level, the N-channel MOS transistors T61 to T64 are turned ON. In response to the column address signal C2 from the column address decoder 61, the column selection circuits 63, 64 activate the column selection signals WS1 to WS4, WS5 to WS8 that correspond to the bit line pair corresponding to the memory cell to be accessed. It is herein assumed that the column selection circuits 63, 64 activate the column selection signals WS1, WS5, respectively. As a result, the N-channel MOS transistor T71 is turned ON and the bit line /BL1 falls to the ground voltage level. On the other hand, since the N-channel MOS transistor T65 is OFF, the bit line /BL is retained at the ½ VDD level.

The sense amplifier driver 66 then activates the sense amplifier S61. The sense amplifier S61 amplifies the potential difference of the bit line pair (BL1, /BL1) and L-level data is written to the memory cell MC61.

As has been described above, in the DRAM of the fourth embodiment, the data lines DL, /DL are used only as signal lines for turning ON/OFF the N-channel MOS transistors T61 to T68. Therefore, the following effects are obtained in addition to the effects obtained by the DRAM of FIG. 6.

The DRAM of the fourth embodiment facilitates the circuit layout as compared to the DRAM of FIG. 6, thereby enabling reduction in area.

Moreover, a circuit for precharging the data lines DL, /DL is not required, thereby enabling reduction in circuit layout area and power consumption.

Note that the N-channel MOS transistors T61 to T68 may be replaced with P-channel MOS transistors or CMOS transistors.

The technique of the present embodiment is also applicable to the DRAMs of FIGS. 1, 4.

(Fifth Embodiment)

Figure 8:
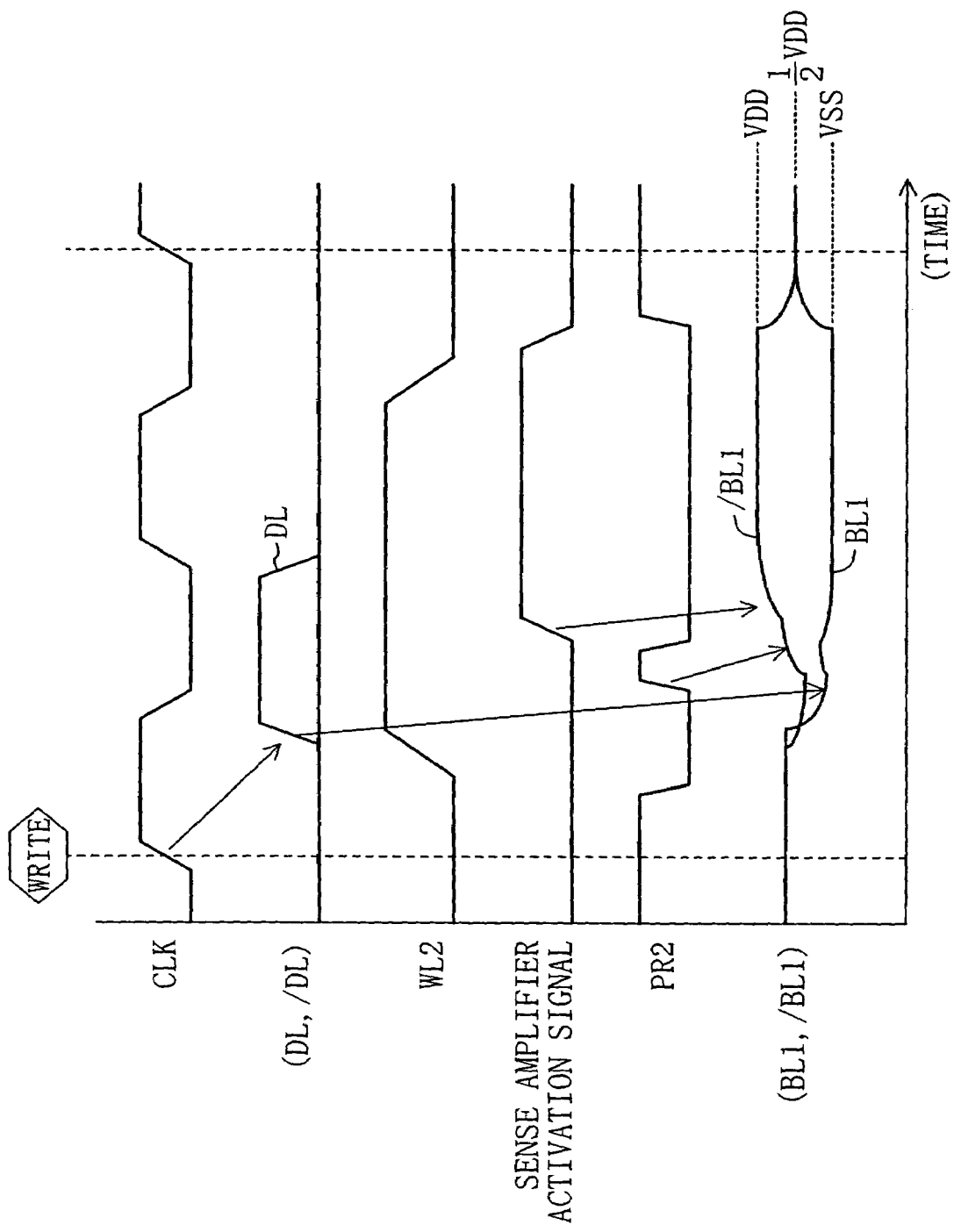
FIG. 8 is a timing chart illustrating write operation according to a fifth embodiment of the present invention.

In the third and fourth embodiments, write operation is conducted by pulling up or pulling down one bit line of a bit line pair. In the fifth embodiment, a technique that is more effective for such write operation will be described with reference to FIGS. 7 and 8. It is herein assumed that H-level data is to be written to the memory cell MC65 storing L-level data.

A write command (WRITE) is applied to the command decoder 62. The command decoder 62 outputs an active enable signal WE in response to the write command. A column address signal corresponding to the memory cell MC65 to be written is applied to the column address decoder 61. The column address decoder 61 outputs an active column address signal C1 to the control circuit 68 in response to the column address signal. In response to this, the control circuit 68 outputs an active signal to the inputs of the AND circuits AD61, AD62. The column address decoder 61 also outputs a column address signal C2 corresponding to the bit line pair (BL1, /BL1) corresponding to the memory cell MC65 to the column selection circuits 63, 64.

The word line WL2 corresponding to the memory cell MC65 is activated and the L-level data is read from the memory cell MC65 to the bit line /BL1. As a result, the bit line /BL falls from the precharge level, i.e., the ½ VDD level.

H-level write data DIN is applied to the AND circuits AD61, AD62. In response to this, the output of the AND circuit AD61 is activated and the data line DL is raised to the power supply voltage (VDD) level. As a result, the N-channel MOS transistors T61 to T64 are turned ON. In response to the column address signal C2 from the column address decoder 61, the column selection circuits 64, 63 activate the column selection signals WS1, WS5, respectively. As a result, the N-channel MOS transistors T71, T75 are turned ON, and the bit line BL1 precharged to the ½ VDD level is pulled down to the ground voltage level.

A precharge signal PR2 is activated for a predetermined period after the bit line BL1 is pulled down to the ground voltage level. As a result, the bit lines BL1, /BL are raised. The bit line /BL1 is raised to the level near the ½ VDD level and the bit line BL1 is slightly raised from the ground voltage level.

The precharge signal PR2 is then inactivated. As a result, the bit line BL1 is again pulled down to the ground voltage level and the bit line /BL1 is retained at the ½ VDD level.

A sense amplifier activation signal is then activated. In response to this, the sense amplifier S61 is activated and amplifies the potential difference of the bit line pair (BL1, /BL1), whereby the H-level data is written to the memory cell MC65.

As has been described above, write operation is conducted by pulling down (or pulling up) one bit line of a bit line pair. In this method, the data read from the memory cell would reduce a write operation margin. Such reduction in write operation margin becomes significant as the capacitance ratio between the bit line and the memory cell is reduced with reduction in power supply voltage.

In the write method of the fifth embodiment, however, the bit line to which the data is read from the memory cell is raised to the precharge level. This ensures the potential difference between bit lines at least in read operation, whereby a sufficient write operation margin is obtained.

(Sixth Embodiment)

[Overall Structure of the DRAM]

Figure 9:
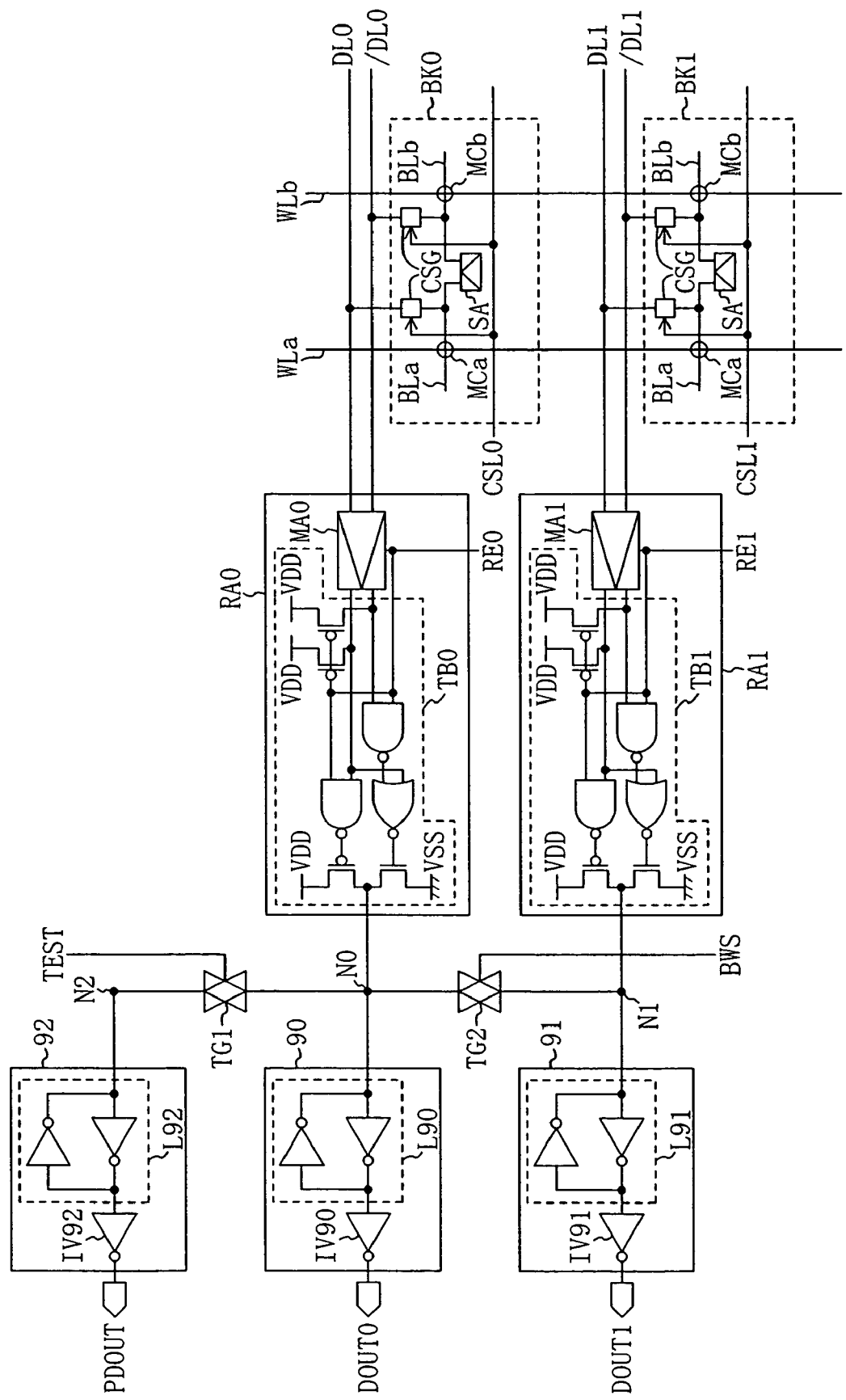
FIGS. 9 and 10 are block diagrams showing the overall structure of a DRAM according to sixth and seventh embodiments of the present invention, respectively.

FIG. 9 is a block diagram showing the overall structure of the DRAM according to the sixth embodiment of the present invention. The DRAM of FIG. 9 includes memory blocks BK0, BK1, data line pairs (DL0, /DL0), (DL1, /DL1), word lines WLa, WLb, column selection lines CSL0, CSL1, read amplifiers RA0, RA1, transfer gates TG1, TG2, output buffers 90 to 92, and data output terminals DOUT0, DOUT1, PDOUT.

Each memory block BK0, BK1 includes a plurality of memory cells arranged in rows and columns (FIG. 9 exemplarily shows memory cells MCa, MCb), a plurality of word lines arranged in rows (FIG. 9 exemplarily shows word lines WLa, WLb), a plurality of bit line pairs arranged in columns (FIG. 9 exemplarily shows a bit line pair (BLa, BLb)), a sense amplifier SA for amplifying the potential difference of the bit line pair (BLa, BLb), and a column selection gate CSG. The column selection gates CSG are provided corresponding to the bit line pair (BLa, BLb) and are connected between the corresponding bit line pair (BLa, BLb) and the corresponding data line pair (DL0, /DL0), (DL1, /DL1).

The word lines WLa, WLb are provided across the memory blocks BK0, BK1. Each column selection line CSL0, CSL1 turns ON/OFF a corresponding column selection gate CSG in response to a column address signal.

The read amplifier RA0 includes a main amplifier MA0 and a tri-state buffer TB0. The main amplifier MA0 is activated in response to an active enable signal RE0 and amplifies a signal on the data line pair (DL0, /DL0). When the enable signal RE0 is active, the tri-state buffer TB0 drives an output node N0 according to the output of the main amplifier MA0. When the enable signal RE0 is inactive, the tri-state buffer TB0 renders the output node N0 in the Hi-Z (high impedance) state. More specifically, the tri-state buffer TB0 drives the output node N0 to H level (power supply voltage (VDD) level) when the enable signal RE0 is active and the main amplifier MA0 amplifies the signal levels of the data line pair (DL0, /DL0) to H level and L level, respectively. On the other hand, the tri-state buffer TB0 drives the output node N0 to L level (ground voltage (VSS) level) when the enable signal RE0 is active and the main amplifier MA0 amplifies the signal levels of the data line pair (DL0, /DL0) to L level and H level, respectively.

The read amplifier RA1 includes a main amplifier MA1 and a tri-state buffer TB1. The main amplifier MA1 amplifies the signals on the data line pair (DL1, /DL1) in response to an active enable signal RE1. When the enable signal RE1 is active, the tri-state buffer TB1 drives an output node N1 according to the output of the main amplifier MA1. When the enable signal RE1 is inactive, the tri-state buffer TB1 renders the output node N1 in the Hi-Z (high impedance) state. More specifically, the tri-state buffer TB1 drives the output node N1 to H level (power supply voltage (VDD) level) when the enable signal RE1 is active and the main amplifier MA1 amplifies the signal levels of the data line pair (DL1, /DL1) to H level and L level, respectively. On the other hand, the tri-state buffer TB1 drives the output node N1 to L level (ground voltage (VSS) level) when the enable signal RE1 is active and the main amplifier MA1 amplifies the signal levels of the data line pair (DL1, /DL1) to L level and H level, respectively.

The transfer gate TG2 is connected between the output node N0 of the tri-state buffer TB0 and the output node N1 of the tri-state buffer TB1, and is turned ON/OFF in response to a bit-width selection signal BWS. When read data is 1-bit data, an active bit-width selection signal BWS is applied. The transfer gate TG2 is turned ON in response to the active bit-width selection signal BWS. When the read data is 2-bit data, an inactive bit-width selection signal BWS is applied. The transfer gate TG2 is turned OFF in response to the inactive bit-width selection signal BWS.

The output buffer 90 includes a latch circuit L90 and an inverter IV90. The latch circuit L90 latches the voltage level of the output node N0 of the tri-state buffer TB0 for output to the inverter IV90. The inverter IV90 inverts the output of the latch circuit L90 for output to the data output terminal DOUT0.

The output buffer 91 includes a latch circuit L91 and an inverter IV91. The latch circuit L91 latches the voltage level of the output node N1 of the tri-state buffer TB1 for output to the inverter IV91. The inverter IV91 inverts the output of the latch circuit L91 for output to the data output terminal DOUT1.

The transfer gate TG1 is connected between the output node N0 of the tri-state buffer TB0 and a node N2, and is turned ON/OFF in response to a test mode signal TEST. When the DRAM is in the test mode, an active test mode signal TEST is applied. The transfer gate TG1 is turned ON in response to the active test mode signal TEST. As a result, the node N0 is connected to the node N2. When the DRAM is in the normal mode, an inactive test mode signal TEST is applied. The transfer gate TG1 is turned OFF in response to the inactive test mode signal TEST. As a result, the node N0 is disconnected from the node N2.

The output buffer 92 includes a latch circuit L92 and an inverter IV92. The latch circuit L92 latches the voltage level of the node N2 for output to the inverter IV92. The inverter L92 inverts the output of the latch circuit L92 for output to the data output terminal PDOUT.

[Read Operation]

Hereinafter, read operation of the above DRAM will be described in terms of the normal mode and the test mode.

(1) In the Normal Mode

An inactive test mode signal TEST is applied and the transfer gate TG1 is turned OFF. The bit width of read data is selected according to a bit-width selection signal BWS. It is herein assumed that 2 bits or 1 bit is selected as the bit width of the read data. Hereinafter, description will be given in terms of 2-bit read data and 1-bit read data.

(a) When Read Data is 2-bit Data

An inactive bit-width selection signal BWS is applied and the transfer gate TG2 is turned OFF. A row decoder (not shown) selects a word line corresponding to a row address signal (in this example, word line WLa). A column decoder (not shown) selects the column selection lines CSL0, CSL1 corresponding to a column address signal. As a result, the column selection gates CSG corresponding to the column selection lines CSL0, CSL1 are turned ON, and the bit line pairs (BLa, BLb) in the memory blocks BK0, BK1 are connected to the data line pairs (DL0, /DL0), (DL1, /DL1), respectively. The data read from the memory cells MCa in the memory blocks BK0, BK1 to the bit line pairs (BLa, BLb) are transferred to the data line pairs (DL0, /DL0), (DL1, /DL1), respectively.

Active enable signals RE0, RE1 are respectively applied to the read amplifiers RA0, RA1, whereby the read amplifiers RA0, RA1 are activated. As a result, the main amplifiers MA0, MA1 amplify the data read to the data line pairs (DL0, /DL0), (DL1, /DL1), respectively. The tri-state buffers TB0, TB1 drive the output nodes N0, N1 to H level or L level according to the data amplified by the main amplifiers MA0, MA1. The latch circuits L90, L91 latch the voltages of the nodes N0, N1 driven by the tri-state buffers TB0, TB1. The inverters IV90, IV91 then invert the data and output the inverted data from the data output terminals DOUT0, DOUT1 to the outside as 2-bit data. The data is thus rapidly output to the data output terminals DOUT0, DOUT1 without conducting any timing adjustment in the latch circuits L90, L91 after activation of the main amplifiers MA0, MA1. The enable signals RE0, RE1 are then inactivated and the tri-state buffers TB0, TB1 are equivalently disconnected from the output nodes N0, N1, respectively (the Hi-Z state). This prevents the data held in the latch circuits L90, L91 from being destroyed. Even if a read instruction is applied, the data held in the latch circuits L90, L91 will not be destroyed unless the enable signals RE0, RE1 are activated.

(b) When Read Data is 1-bit Data

An active bit-width selection signal BWS is applied and the transfer gate TG2 is turned ON. A row decoder (not shown) selects a word line corresponding to a row address signal (in this example, word line WLa). A column decoder (not shown) selects the column selection line CSL0 or CSL1 corresponding to a column address signal (in this example, the column selection line CSL1). As a result, the column selection gate CSG corresponding to the column selection line CSL1 is turned ON, whereby the bit line pair (BLa, BLb) in the memory block BK1 is connected to the data line pair (DL1, /DL1). The data read from the memory cell MCa in the memory block BK1 to the bit line pair (BLa, BLb) is transferred to the data line pair (DL1, /DL1).

An inactive enable signal RE0 is applied to the read amplifier RA0 and an active enable signal RE1 is applied to the read amplifier RA1. The main amplifier MA0 and the tri-state buffer TB0 are inactivated in response to the inactive enable signal RE0. As a result, the tri-state buffer TB0 is equivalently disconnected from the output node N0 (the Hi-Z state). On the other hand, the main amplifier MA1 and the tri-state buffer TB1 are activated in response to the active enable signal RE1. The main amplifier MA1 amplifies the data read to the data line pair (DL1, /DL1). The tri-state buffer TB1 drives the output node N1 to H level or L level according to the data amplified by the main amplifier MA1. The voltage of the output node N1 driven by the tri-state buffer TB1 is transferred to the output node N0 through the transfer gate TG2 and latched by the latch circuit L90. The inverter IV90 inverts the data latched by the latch circuit L90 and outputs the inverted data from the data output terminal DOUT0 to the outside as 1-bit data. The data is thus rapidly output to the data output terminal DOUT0 without conducting any timing adjustment in the latch circuit L90 after activation of the main amplifier MA1. The enable signal RE1 is then inactivated and the tri-state buffer TB1 is equivalently disconnected from the output node N1 (the Hi-Z state).

Note that, when the read data is 1-bit data, the latch circuit L91 that is not used is not allowed to latch the data. This prevents data conflict between the latch circuits when the output node N0 is connected to the output node N1.

As has been described above, the read amplifiers RA0, RA1 are activated in response to active enable signals RE0, RE1 and drive the output nodes N0, N1 according to the data read to the data line pairs (DL0, /DL0), (DL1, /DL1), respectively. The read amplifiers RA0, RA1 are inactivated in response to inactive enable signals RE0, RE1 and render the output nodes N0, N1 in the Hi-Z state. This eliminates the need to control the timing of latching and outputting the data in the latch circuits L90, L91 in the subsequent stage. As a result, the data is rapidly output to the data output terminals DOUT0, DOUT1 without timing control after activation of the main amplifiers MA0, MA1.

No timing control is required for the latch circuits L90, L91 and activation and inactivation of the enable signals RE0, RE1 need only be controlled. This enables reduction in layout area of the control circuit.

The transfer gate TG2 is provided between the output node N0 in the previous stage of the latch circuit L90 and the output node N1 in the previous stage of the latch circuit L91. This eliminates the need for timing adjustment of the latch circuits L90, L91 even when the bit width of the read data is varied.

(2) In the Test Mode

An active test mode signal TEST is applied and the transfer gate TG1 is turned ON. The transfer gate TG2 is also turned ON. Test data is read from a memory cell in the memory block BK0 or BK1 and transferred to the data line pair (DL0, /DL0) or (DL1, /DL1) as in the normal mode. As in the normal mode, the test data thus transferred to the data line pair (DL0, /DL0) or (DL1, /DL1) is amplified by the read amplifier RA0 or RA1 for output to the output node N0 or N1. The test data thus output to the output node N0 or N1 is transferred to the node N2 through the transfer gate TG1 (and TG2) and latched by the latch circuit L92. The inverter IV92 inverts the test data latched by the latch circuit L92 and outputs the inverted test data from the test data output terminal PDOUT.

In the DRAM of FIG. 9, the transfer gate TG1 is provided between the node N2 in the previous stage of the latch circuit L92 and the output node N0. This reduces the load on the output buffer as compared to the case where a plurality of normal outputs are electrically gathered at the output end by using a switch or the like and examined as a single test output. This enables signal transmission to a system receiving the output data to be conducted in the same manner as that in the normal mode.

Moreover, the transfer gate TG1 provided between the node N2 in the previous stage of the latch circuit L92 and the output node N0 eliminates the need for timing adjustment of the latch circuit L92 used in the test mode. Accordingly, the test data is rapidly output to the data output terminal PDOUT without timing control after activation of the main amplifier MA0 or MA1.

Note that, in the test mode, the latch circuits L90, L91 of the output buffers 90, 91 are not allowed to latch the data. This prevents data conflict between the latch circuits when the node N2 is connected to the output nodes N0, N1. This enables the latch circuit L92 in the test mode to have the same data holding characteristics as those of the latch circuits L90, L91 in the normal mode. Moreover, reduction in load enables improvement in latch capability.

(Seventh Embodiment)

[Overall Structure of the DRAM]

Figure 10:
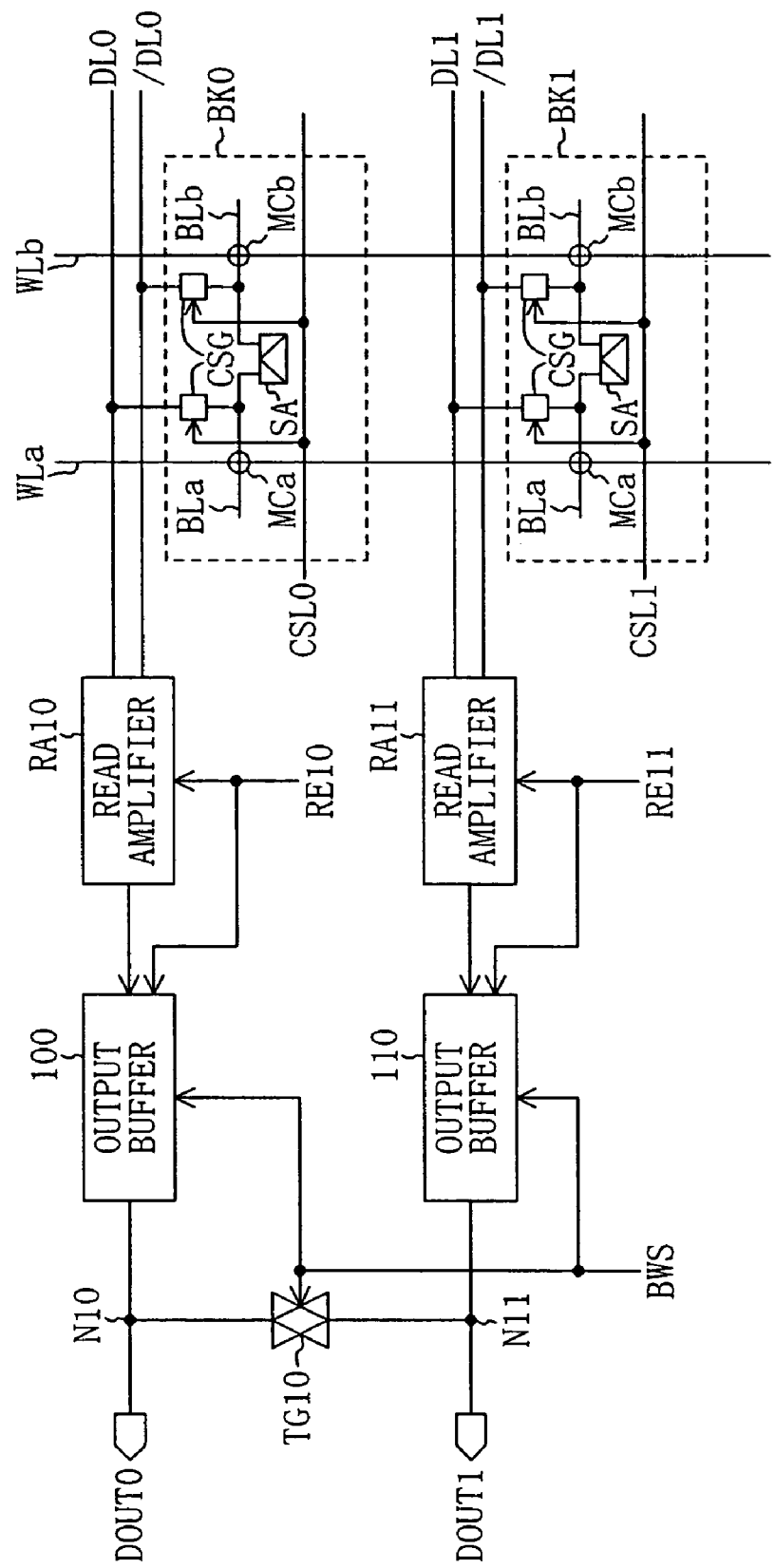

FIG. 10 is a block diagram showing the overall structure of the DRAM according to the seventh embodiment of the present invention. The DRAM of FIG. 10 includes memory blocks BK0, BK1, data line pairs (DL0, /DL0), (DL1, /DL1), word lines WLa, WLb, column selection lines CSL0, CSL1, read amplifiers RA10, RA11, output buffers 100, 110, a transfer gate TG10, and data output terminals DOUT0, DOUT1.

The read amplifiers RA10, RA11 are activated in response to active enable signals RE10, RE11 and amplify the signals on the data line pairs (DL0, /DL0), (DL1, /DL1), respectively.

The output buffers 100, 110 are activated in response to active enable signals RE10, RE11 and output the output signals of the read amplifiers RA10, RA11 to the data output terminals DOUT0, DOUT1 with driving capability corresponding to a bit-width selection signal BWS, respectively.

The transfer gate TG10 is connected between nodes N10, N11 and is turned ON/OFF in response to a bit-width selection signal BWS. The nodes N10, N11 are provided between the output nodes of the output buffers 100, 110 and the data output terminals DOUT0, DOUT1, respectively. When read data is 1-bit data, an active bit-width selection signal BWS is applied. The transfer gate TG10 is turned ON in response to the active bit-width selection signal BWS. When the read data is 2-bit data, an inactive bit-width selection signal BWS is applied. The transfer gate TG10 is turned OFF in response to the inactive bit-width selection signal BWS.

[Internal Structure of Output Buffer]

Figure 11:
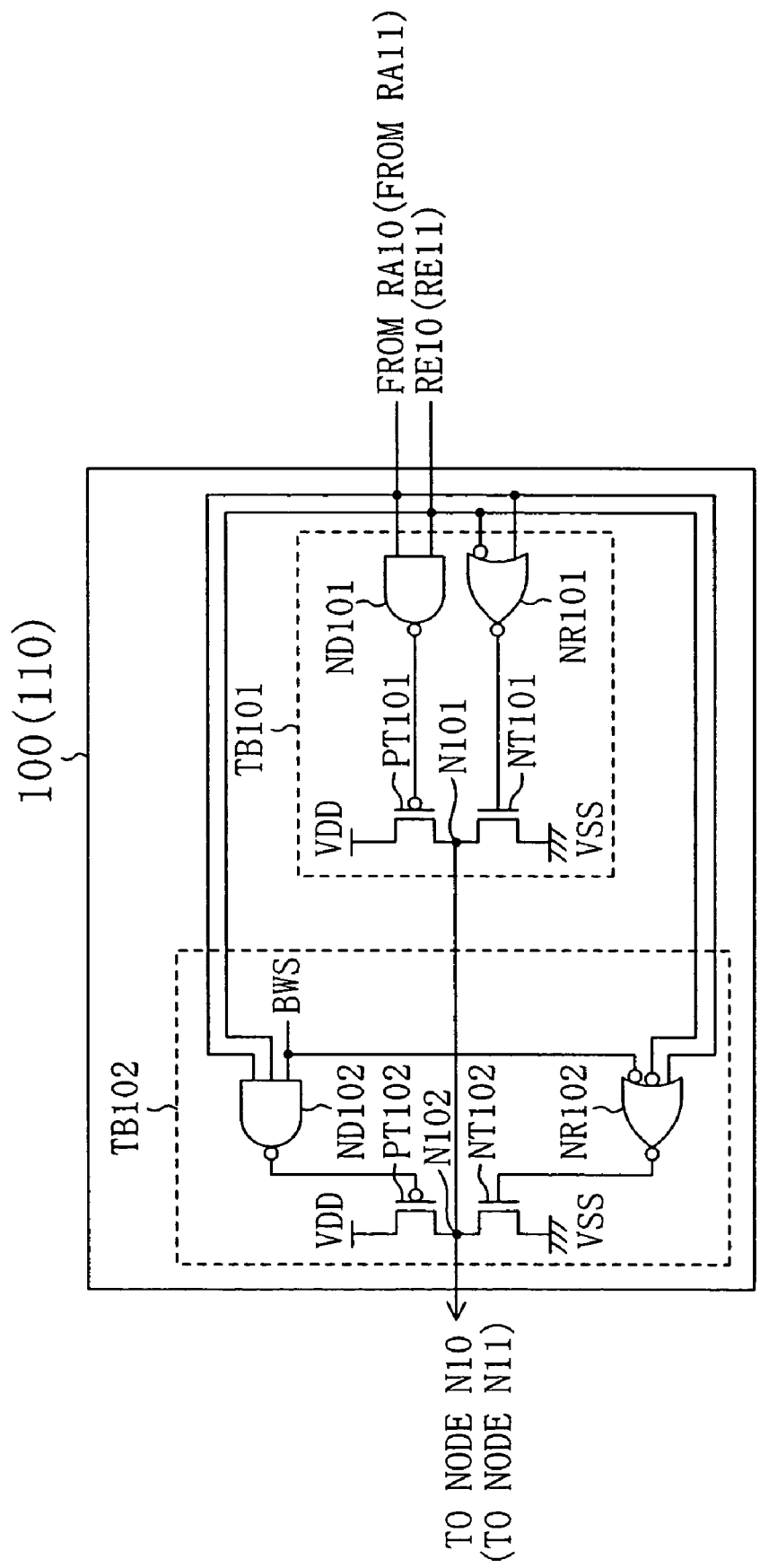
FIG. 11 is a block diagram showing the internal structure of an output buffer in FIG. 10.

FIG. 11 is a block diagram showing the internal structure of the output buffer 100 in FIG. 10. Referring to FIG. 11, the output buffer 100 includes tri-state buffers TB101, TB102.

The tri-state buffer TB101 includes a NAND circuit ND101, a NOR circuit NR101, a P-channel MOS transistor PT101 and an N-channel MOS transistor NT101. The NAND circuit ND101 outputs the NAND operation result of the output signal of the read amplifier RA10 and the enable signal RE10. The NOR circuit NR11 outputs the NOR operation result of an inverted signal of the enable signal RE10 and the output signal of the read amplifier RA10. The P-channel MOS transistor PT101 is connected between a power supply node and an output node N101 and receives the output of the NAND circuit 101 at its gate. The power supply node receives a power supply voltage VDD. The N-channel MOS transistor NT101 is connected between the output node N101 and a ground node and receives the output of the NOR circuit NR101 at its gate. The ground node receives a ground voltage VSS. The output node N101 is connected to the node N10 of FIG. 10.

When the enable signal RE10 is active, the tri-state buffer TB101 having the above structure drives the output node N101 according to the output signal of the read amplifier RA10. When the enable signal RE10 is inactive, the tri-state buffer TB11 renders the output node N101 in the Hi-Z (high impedance) state.

The tri-state buffer TB102 includes a NAND circuit ND102, a NOR circuit NR102, a P-channel MOS transistor PT102 and an N-channel MOS transistor NT102. The NAND circuit ND102 outputs the NAND operation result of the output signal of the read amplifier RA10, the enable signal RE10 and the bit-width selection signal BWS. The NOR circuit NR102 outputs the NOR operation result of an inverted signal of the bit-width selection signal BWS, an inverted signal of the enable signal RE10 and the output signal of the read amplifier RA10. The P-channel MOS transistor PT102 is connected between the power supply node and an output node N102 and receives the output of the NAND circuit ND102 at its gate. The N-channel MOS transistor NT102 is connected between the output node N102 and the ground node and receives the output of the NOR circuit NR102 at its gate. The output node N102 is connected to the node N10 of FIG. 10.

When the bit-width selection signal BWS and the enable signal RE10 are both active, the tri-state buffer TB102 having the above structure drives the output node N102 according to the output signal of the read amplifier RA10. When at least one of the bit-width selection signal BWS and the enable signal RE10 is inactive, the tri-state buffer TB102 renders the output node N102 in the Hi-Z (high impedance) state.

Note that the output buffer 110 of FIG. 10 has the same internal structure as that of the output buffer 100 of FIG. 11.

[Read Operation]

Hereinafter, read operation of the above DRAM will be described with reference to FIGS. 10 and 11. In this DRAM, the bit width of the read data can be switched between 2 bits and 1 bit according to the bit-width selection signal BWS. Hereinafter, description will be given in terms of 2-bit read data and 1-bit read data.

(1) When Read Data is 2-bit Data

An inactive bit-width selection signal BWS is applied and the transfer gate TG10 is turned OFF. The tri-state buffers TB102 in the output buffers 100, 110 are inactivated and the output node N102 is rendered in the Hi-Z (high impedance) state.

A row decoder (not shown) selects a word line corresponding to a row address signal (in this example, word line WLa). A column decoder (not shown) selects the column selection lines CSL0, CSL1 corresponding to a column address signal. As a result, the column selection gates CSG corresponding to the column selection lines CSL0, CSL1 are turned ON, and the bit line pairs (BLa, BLb) in the memory blocks BK0, BK1 are connected to the data line pairs (DL0, /DL0), (DL1, /DL1), respectively. The data read from the memory cells MCa in the memory blocks BK0, BK1 to the bit line pairs (BLa, BLb) are transferred to the data line pairs (DL0, /DL0), (DL1, /DL1), respectively.

Active enable signals RE10, RE11 are applied to the read amplifiers RA10, RA11 and the output buffers 100, 110, respectively. The read amplifiers RA10, RA11 are activated in response to the active enable signals RE10, RE11. The read amplifiers RA10, RA11 amplify the data read to the data line pairs (DL0, /DL0), (DL1, /DL1), respectively.

The tri-state buffers TB101 in the output buffers 100, 110 are activated in response to the active enable signals RE10, RE11. The tri-state buffers TB102 are kept inactive. The tri-state buffers TB101 in the output buffers 100, 110 drive the respective output nodes N101 according to the output signals of the read amplifiers RA10, RA11. The voltages on the output nodes N101 driven by the tri-state buffers TB101 in the output buffers 100, 110 are output from the data output terminals DOUT0, DOUT1 to the outside as 2-bit data.

(2) When Read Data is 1-bit Data

An active bit-width selection signal BWS is applied and the transfer gate TG10 is turned ON. A row decoder (not shown) selects a word line corresponding to a row address signal (in this example, word line WLa). A column decoder (not shown) selects the column selection line CSL0 or CSL1 corresponding to a column address signal (in this example, the column selection line CSL0). As a result, the column selection gate CSG corresponding to the column selection line CSL0 is turned ON and the bit line pair (BLa, BLb) in the memory block BK0 is connected to the data line pair (DL0, /DL0). The data read from the memory cell MCa in the memory block BK0 to the bit line pair (BLa, BLb) is transferred to the data line pair (DL0, /DL0).

An active enable signal RE10 is applied to the read amplifier RA10 and an inactive enable signal RE11 is applied to the read amplifier RA11. The read amplifier RA11 and the output buffer 110 are inactivated in response to the inactive enable signal RE11. As a result, the output nodes N101, N102 in the tri-state buffers TB101, TB102 of the output buffer 110 are rendered in the Hi-Z state. The read amplifier RA10 is activated in response to the active enable signal RE10 and amplifies the data read to the data line pair (DL0, /DL0). The tri-state buffers TB101, TB102 in the output buffer 100 are also activated in response to the active enable signal RE10. The tri-state buffers TB101, TB102 in the output buffer 100 drive the output nodes N101, N102 according to the output signal of the read amplifier RA10. In other words, the tri-state buffers TB101, TB102 drive the node N10. When the read data is 1-bit data, elements like wirings between the nodes N10 and N11, the transfer gate TG10 and the like provide greater load on the output buffers 100, 110 than when the read data is 2-bit data. In view of this, when the read data is 1-bit data, both the tri-state buffers TB101, TB102 are operated. This allows the output buffers 100, 110 to have superior driving capability than when the read data is 2-bit data. The voltage of the node N10 driven by the tri-state buffers TB11, TB102 in the output buffer 100 is output as 1-bit data from the data output terminal DOUT1 through the transfer gate TG10 and the node N11.

Note that the data output terminal DOUT1 is herein used as an output terminal of 1-bit data. However, the data output terminal DOUT0 may alternatively be used as an output terminal of 1-bit data. In this case, the driving capability of the output buffer 110 is enhanced in the same manner as that described above for the output buffer 100.

As has been described above, in the DRAM of the seventh embodiment, each output buffer 100, 110 includes tri-state buffers TB101, TB102. This allows the output buffers 100, 110 to have superior driving capability when the read data is 1-bit data than when the read data is 2-bit data. This reduces variation in access time between 2-bit read data and 1-bit read data.

When the read data is 1-bit data, the output buffer 100 or 110 that is not involved in read operation is inactivated. This suppresses increase in the overall power consumption of the DRAM even if the driving capability of the output buffer that is involved in read operation is enhanced.

Although read operation has been described for 2-bit read data and 1-bit read data, the above output buffers are similarly applicable to the read data having other bit widths.

Each output buffer 100, 110 includes two tri-state buffers. However, each output buffer 100, 110 may alternatively include three or more tri-state buffers.

Each output buffer may be controlled so that the tri-state buffers provided corresponding to the bit width is activated when the read data has a predetermined bit width or when the read data has a certain bit width or less.

The bit width selection signal BWS may be controlled by using an external input that is capable of recognizing the bit width or a fuse element that is assigned to the bit width.

The output buffers 100, 110 described herein are applied as buffers capable of varying the driving capability according to the bit width. However, buffers having the same structure as that of the output buffers 100, 110 are also applicable to an input circuit, an output circuit or the like that has the load varied according to the bit width.

The driving capability of the output buffers 100, 110 is herein varied according to the bit width of the read data. However, the driving capability of the output buffers 100, 110 may be varied if the capability of an actual device such as access time is degraded. In this case, a more optimal semiconductor memory device can be provided.

(Eighth Embodiment)

Figure 12:
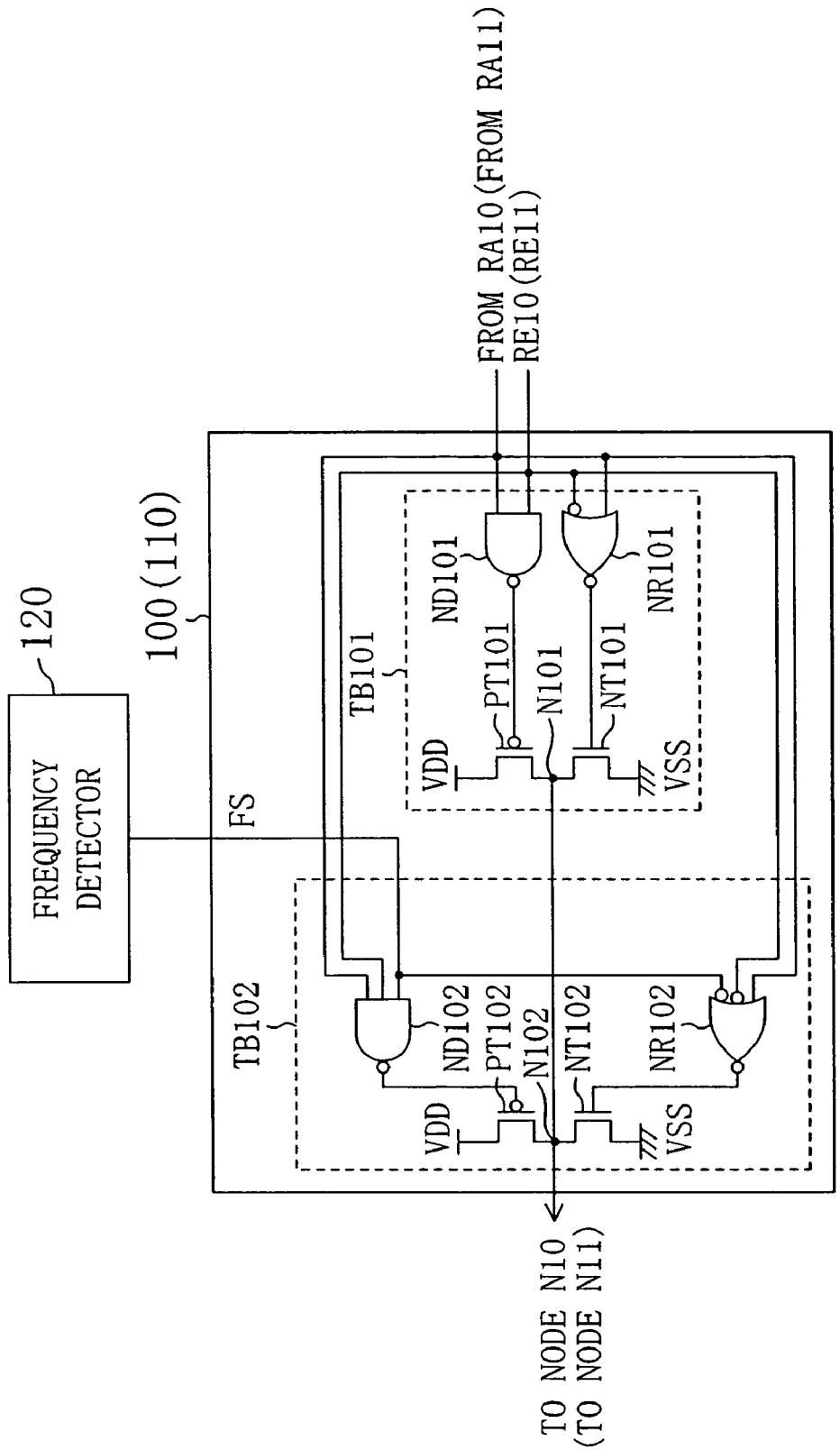
FIG. 12 is a block diagram showing the internal structure of an output buffer according to an eighth embodiment of the present invention.

The DRAM of the eighth embodiment of the present invention includes output buffers 100, 110 of FIG. 12 instead of the output buffers 100, 110 of FIG. 11, and additionally includes a frequency detector 120 in FIG. 12. The structure of the DRAM of the eighth embodiment is otherwise the same as that of the DRAM of FIG. 10.

Referring to FIG. 12, the frequency detector 120 outputs an active determination signal FS when the operating frequency of the DRAM is a predetermined frequency or higher. Otherwise, the frequency detector 120 outputs an inactive determination signal FS.

The NAND circuit ND102 in the tri-state buffer TB102 outputs the NAND operation result of the output signal of the read amplifier RA10 (RA11), the enable signal RE10 (RE11), and the determination signal FS. The NOR circuit NR102 outputs the NOR operation result of an inverted signal of the determination signal FS, an inverted signal of the enable signal RE10 (RE11), and the output signal of the read amplifier RA10 (RA11). When the determination signal FS and the enable signal RE10 (RE11) are both active, the tri-state buffer TB102 of FIG. 12 drives the output node N102 according to the output signal of the read amplifier RA10 (RA11). When at least one of the determination signal FS and the enable signal RE10 (RE11) is inactive, the tri-state buffer TB102 renders the output node N102 in the Hi-Z (high impedance) state.

Hereinafter, operation of the output buffer 100 (110) having the above structure will be described.

When the operating frequency of the DRAM is lower than the predetermined frequency, the frequency detector 120 outputs an inactive determination signal FS. In response to the inactive determination signal FS, the tri-state buffer TB102 is inactivated and the output node N102 is rendered in the Hi-Z state. The output buffer 100 (110) thus drives the node N10 (N11) by using only the tri-state buffer TB101.

On the other hand, when the operating frequency of the DRAM is equal to or higher than the predetermined frequency, the frequency detector 120 outputs an active determination signal FS. As a result, the output buffer 100 (110) drives the node N10 (N11) by the tri-state buffers TB102, TB101.

As has been described above, the output buffers 100, 110 inactivate the tri-state buffer TB102 when the operating frequency of the DRAM is lower than the predetermined frequency. This enables reduction in the overall power consumption by the amount consumed by the tri-state buffer TB102.

Moreover, in the case where the specification does not have a limitation on the access time and the cycle time, varying the driving capability of the output buffers according to the operating frequency enables optimal power consumption to be automatically determined.

(Ninth Embodiment)

[Overall Structure of the DRAM]

Figure 13:
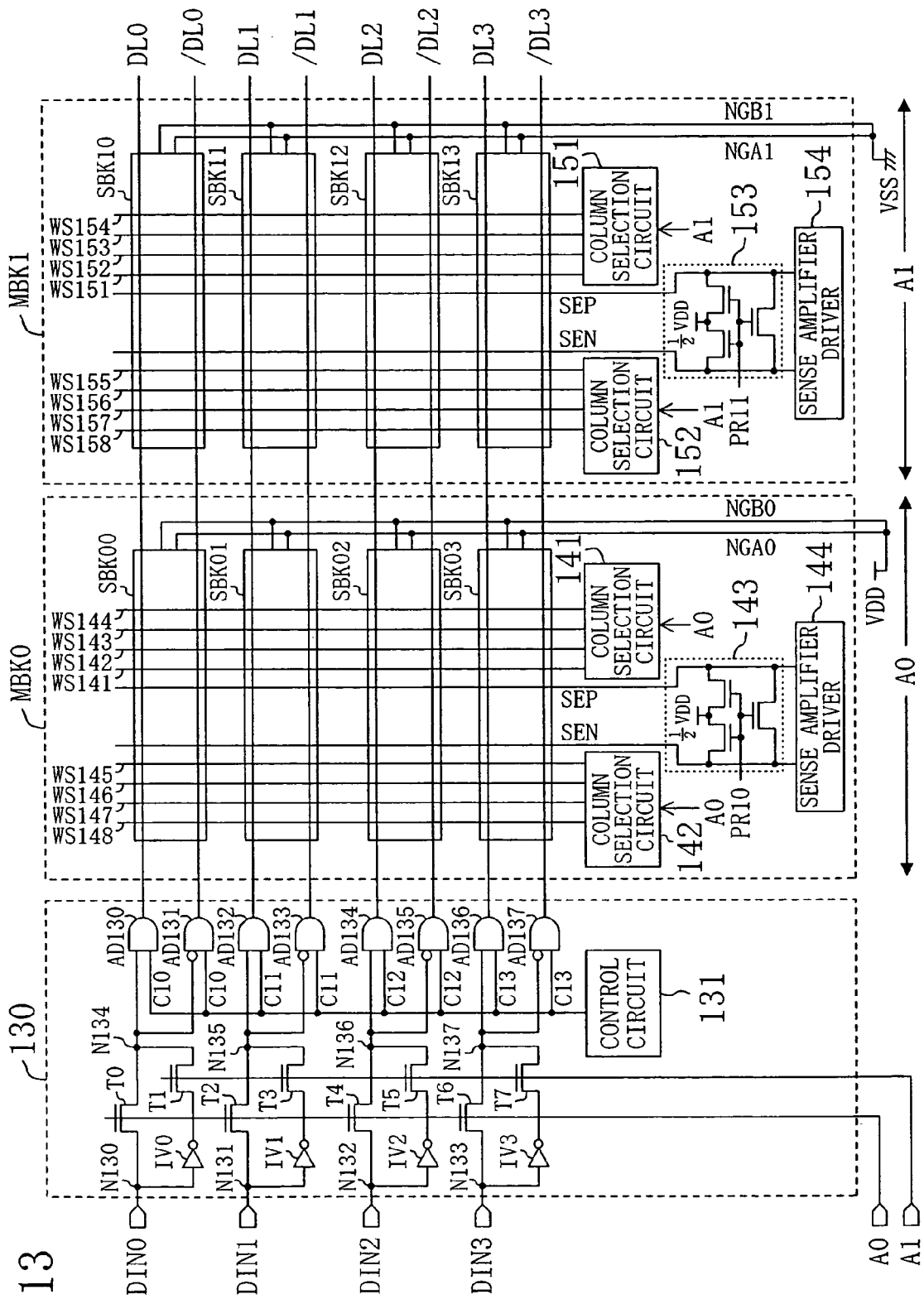
FIG. 13 is a block diagram showing the overall structure of a DRAM according to a ninth embodiment of the present invention.

FIG. 13 is a block diagram showing the overall structure of the DRAM according to the ninth embodiment of the present invention. The DRAM of FIG. 13 includes a write circuit 130, main blocks MBK0, MBK1, and data line pairs (DL0, /DL0) to (DL3, /DL3).

The write circuit 130 includes inverters IV0 to IV3, N-channel MOS transistors T0 to T7, AND circuits AD130 to AD137 and a control circuit 131. The N-channel MOS transistors T0, T2, T4, T6 are connected between nodes N130 to N133 and nodes N134 to N137, respectively, and are turned ON/OFF in response to an address bit A0. The address bit A0 is a part of an address signal corresponding to a memory cell to be accessed. The nodes N130 to N133 receive write data DIN0 to DIN3, respectively. The inverters IV0 to IV3 are connected between the nodes N130 to N133 and the N-channel MOS transistors T1, T3, T5, T7 and invert the write data DIN0 to DIN3, respectively. The N-channel MOS transistors T1, T3, T5, T7 are connected between the output nodes of the inverters IV0 to IV3 and the nodes N134 to N137, respectively, and are turned ON/OFF in response to an address bit A1. The address bit A1 is a part of an address signal corresponding to a memory cell to be accessed. The control circuit 131 outputs control signals C10 to C13 in response to a column address signal. The AND circuits AD130, AD132, AD134, AD136 output the AND operation result of the write data applied to the nodes N134 to N137 and the control signals C10 to C13 from the control circuit 131 to data lines DL0 to DL3, respectively. The AND circuits AD131, AD133, AD135, AD137 output the AND operation result of inverted data of the write data applied to the nodes N134 to N137 and the control signals C10 to C13 from the control circuit 131 to the data lines /DL0 to /DL3, respectively.

The main block MBK0 includes sub blocks SBK00 to SBK03, column selection circuits 141, 142, column selection lines WS141 to WS148, a bit-line precharge circuit 143, a sense amplifier driver 144, and wirings NGA0, NGB0. The wirings NGA0, NGB0 have their one ends connected to a power supply node receiving a power supply voltage VDD and the other ends connected to the sub blocks SBK00 to SBK03. The sub blocks SBK00 to SBK03 are provided corresponding to the data line pairs (DL0, /DL0) to (DL3, /DL3). The column selection circuits 141, 142 are activated in response to the address bit A0 and activate column selection lines WS141 to WS144, WS145 to WS148 corresponding to a column address signal. The bit-line precharge circuit 143 precharges bit lines (not shown) in the sub blocks SBK00 to SBK03 to the ½ VDD level through wirings SEP, SEN in response to a precharge signal PR10. The sense amplifier driver 144 activates sense amplifiers (not shown) in the sub blocks SBK00 to SBK03.

The main block MBK1 includes sub blocks SBK10 to SBK13, column selection circuits 151, 152, column selection lines WS151 to WS158, a bit-line precharge circuit 153, a sense amplifier driver 154, and wirings NGA1, NGB1. The wirings NGA1, NGB1 have their one ends connected to a ground node receiving a ground voltage VSS and the other ends connected to the sub blocks SBK10 to SBK13. The sub blocks SBK10 to SBK13 are provided corresponding to the data line pairs (DL0, /DL0) to (DL3, /DL3). The column selection circuits 151, 152 are activated in response to the address bit A1 and activate column selection lines WS151 to WS154, WS155 to WS158 corresponding to a column address signal. The bit-line precharge circuit 153 precharges bit lines (not shown) in the sub blocks SBK10 to SBK13 to the ½ VDD level through wirings SEP, SEN in response to a precharge signal PR11. The sense amplifier driver 154 activates sense amplifiers (not shown) in the sub blocks SBK10 to SBK13.

[Internal Structure of the Sub Block SBK00]

Figure 14:
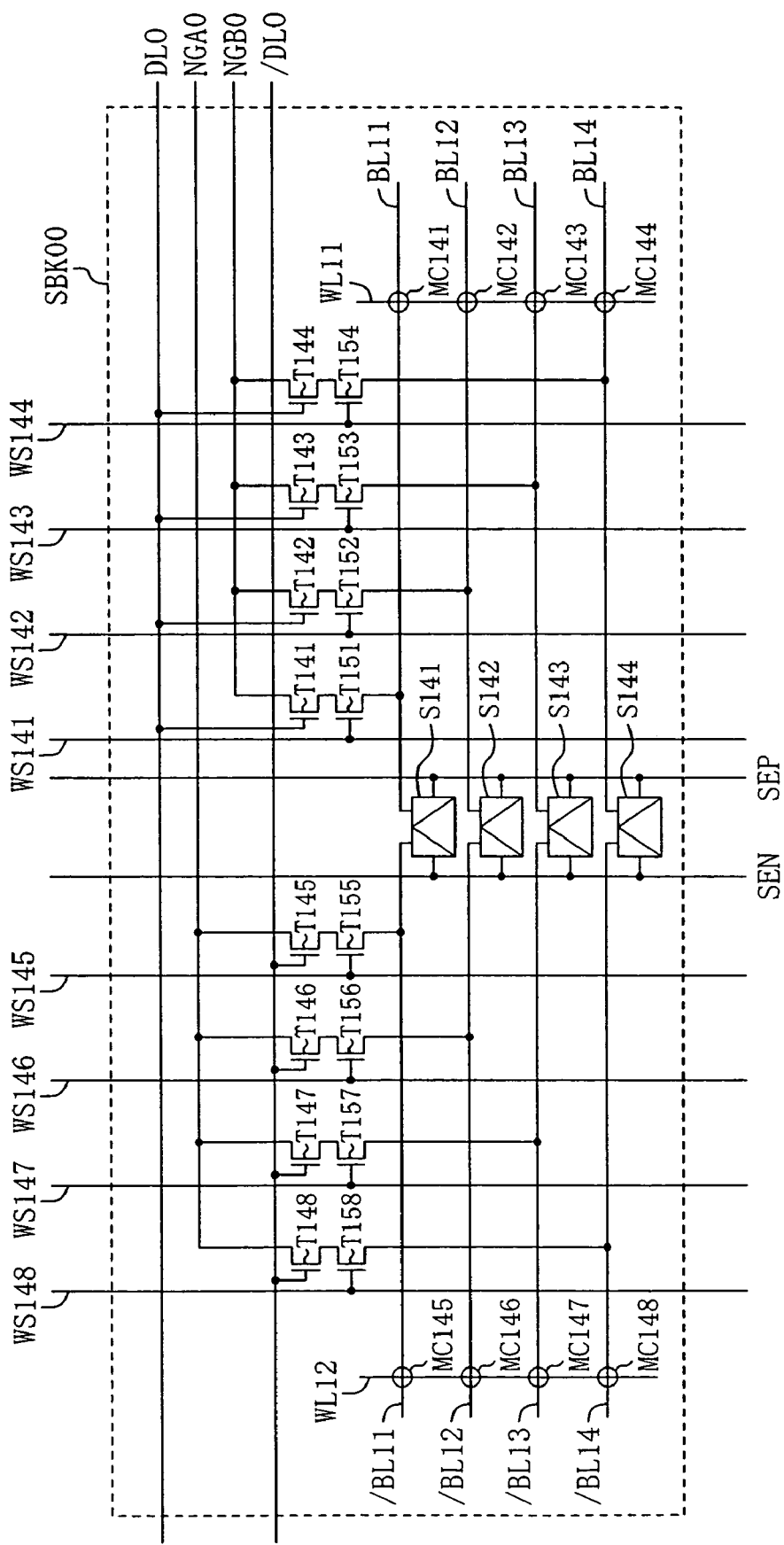
FIG. 14 is a block diagram showing the internal structure of a sub block in FIG. 13.

FIG. 14 is a block diagram showing the internal structure of the sub block SBK00 of FIG. 13. Referring to FIG. 14, the sub block SBK00 includes memory cells MC141 to MC148, word lines WL11, WL12, bit line pairs (BL11, /BL11) to (BL14, /BL14), sense amplifiers S141 to S144, and N-channel MOS transistors T141 to T148, T151 to T158.

The memory cells MC141 to MC148 are arranged in rows and columns. The word lines WL11, WL12 are arranged in rows. The word line WL11 is provided corresponding to the memory cells MC141 to MC144. The word line WL12 is provided corresponding to the memory cells MC145 to MC148. The bit line pairs (BL11, /BL11) to (BL14, /BL14) are arranged in columns. The bit lines BL11 to BL14 are provided corresponding to the memory cells MC141 to MC144. The bit lines /BL11 to /BL14 are provided corresponding to the memory cells MC145 to MC148.

The N-channel MOS transistors T141 to T144 are connected between the wiring NGB0 and the N-channel MOS transistors T151 to T154, respectively, and receive the voltage on the data line DL0 at their gates. The N-channel MOS transistors T151 to T154 are connected between the N-channel MOS transistors T141 to T144 and the bit lines BL11 to BL14 and are turned ON/OFF in response to the voltage levels on the column selection lines WS141 to WS144, respectively.

The N-channel MOS transistors T145 to T148 are connected between the wiring NGA0 and the N-channel MOS transistors T155 to T158, respectively, and receive the voltage on the data line /DL0 at their gates. The N-channel MOS transistors T155 to T158 are connected between the N-channel MOS transistors T145 to T148 and the bit lines /BL11 to /BL14 and are turned ON/OFF in response to the voltage levels on the column selection lines WS145 to WS148, respectively.

The sense amplifiers S141 to S144 amplify the voltage difference of the bit line pairs (BL11, /BL11) to (BL14, /BL14), respectively.

Note that the sub blocks SBK00 to SBK03, SBK10 to SBK13 have the same internal structure as that of the sub block SBK00 in FIG. 14.

[Write Operation]

Hereinafter, write operation of the above DRAM will be described. In this DRAM, write operation is conducted by pulling up or pulling down one bit line of a bit line pair precharged to the ½ VDD level. More specifically, data is written to the sub blocks SBK00 to SBK03 in the main block MBK0 by pulling up one bit line of a bit line pair, and data is written to the sub blocks SBK10 to SBK13 in the main block MBK1 by pulling down one bit line of a bit line pair. The main block MBK0 is selected by the address bit A0 of the address signal, and the main block MBK1 is selected by the address bit A1 of the address signal. Hereinafter, write operation to the memory cells in the main block MBK0 and write operation to the memory cells in the main block MBK1 will be described.

(1) When Data is Written to the Memory Cells in the Main Block MBK0

It is herein assumed that H-level data DIN0 to DIN3 are written to the memory cells MC141 in the sub blocks SBK00 to SBK03.

First, the bit-line precharge circuit 143 precharges the bit line pairs (BL11, /BL11) to (BL14, /BL14) in the sub blocks SBK00 to SBK03 to the ½ VDD level.

An address signal corresponding to a memory cell to be accessed is applied. The address bit A0 of the address signal is activated and the address bit A1 thereof is inactivated. The N-channel MOS transistors T0, T2, T4, T6 in the write circuit 130 are turned ON in response to the active address bit A0. On the other hand, the N-channel MOS transistors T1, T3, T5, T7 are turned OFF in response to the inactive address bit A1. H-level write data DIN0 to DIN3 are applied to the inputs of the AND circuits AD130 to AD137 through the N-channel MOS transistors T0, T2, T4, T6. In response to the address signal, the control circuit 131 applies active control signals C10 to C13 to the AND circuits AD130 to AD137. As a result, the outputs of the AND circuits AD130, AD132, AD134, AD136 are activated and the outputs of the AND circuits AD131, AD133, AD135, AD137 are inactivated. In other words, the data lines DL0 to DL3 rise to H level (VDD level) and the data lines /DL0 to /DL3 fall to L level (VSS level). As a result, the N-channel MOS transistors T141 to T144 in the sub blocks SBK00 to SBK03 are turned ON, and the N-channel MOS transistors T145 to T148 in the sub blocks SBK00 to SBK03 are turned OFF.

In response to the address signal, the word lines WL11 in the sub blocks SBK00 to SBK03 are activated. As a result, data is read from the memory cell MC141 to the bit line BL11 in each sub block SBK00 to SBK03. In response to the active address bit A0, the column selection circuits 141, 142 are activated, and activate the column selection lines WS141, WS145. As a result, the N-channel MOS transistors T151, T155 in the sub blocks SBK00 to SBK03 are turned ON. Since the N-channel MOS transistors T141 are ON, the bit lines BL11 in the sub blocks SBK00 to SBK03 are connected to the wiring NGB0. The other end of the wiring NGB0 is connected to the power supply node. Therefore, the potential on the bit lines BL11 rises from the precharge level. On the other hand, since the N-channel MOS transistor T145 is OFF, the potential on the bit lines /BL11 is retained at the ½ VDD level. The sense amplifiers S141 are activated and amplify the potential difference of the respective bit line pairs (BL11, /BL11). As a result, the potential on the bit lines BL11 rises to the VDD level, and the potential on the bit lines /BL11 falls to the VSS level. The H-level data DIN0 to DIN3 are thus written to the memory cells MC141 of the sub blocks SBK00 to SBK03.

(2) When Data is Written to the Memory Cells in the Main Block MBK1

It is herein assumed that H-level data DIN0 to DIN3 are written to the memory cells MC141 in the sub blocks SBK10 to SBK13.

First, the bit-line precharge circuit 153 precharges the bit line pairs (BL11, /BL11) to (BL14, /BL14) in the sub blocks SBK10 to SBK13 to the ½ VDD level.

An address signal corresponding to a memory cell to be accessed is applied. The address bit A0 of the address signal is inactivated and the address bit A1 thereof is activated. The N-channel MOS transistors T1, T3, T5, T7 in the write circuit 130 are turned ON in response to the active address bit A1. On the other hand, the N-channel MOS transistors T0, T2, T4, T6 are turned OFF in response to the inactive address bit A0. The inverters IV0 to IV3 invert the H-level write data DIN0 to DIN3 and apply the inverted write data to the inputs of the AND circuits AD130 to AD137 through the N-channel MOS transistors T1, T3, T5, T7. In response to the address signal, the control circuit 131 applies active control signals C10 to C13 to the AND circuits AD130 to AD137. As a result, the outputs of the AND circuits AD131, AD133, AD135, AD137 are activated and the outputs of the AND circuits AD130, AD132, AD134, AD136 are inactivated. In other words, the data lines DL0 to DL3 fall to L level (VSS level) and the data lines /DL0 to /DL3 rise to H level (VDD level). As a result, the N-channel MOS transistors T145 to T148 in the sub blocks SBK10 to SBK13 are turned ON and the N-channel MOS transistors T141 to T144 in the sub blocks SBK10 to SBK13 are turned OFF.

The word lines WL11 in the sub blocks SBK10 to SBK13 are activated in response to the address signal. As a result, data is read from the memory cell MC141 to the bit line BL11 in each sub block SBK10 to SBK13. In response to the active address bit A1, the column selection circuits 151, 152 are activated, and activate the column selection lines WS151, WS155. As a result, the N-channel MOS transistors T151, T155 in the sub blocks SBK10 to SBK13 are turned ON. Since the N-channel MOS transistors T141 is OFF, the potential on the bit line BL11 is retained at the ½ VDD level. On the other hand, since the N-channel MOS transistor T145 is ON, the bit lines /BL11 in the sub blocks SBK10 to SBK13 are connected to the wiring NGA1. The other end of the wiring NGA1 is connected to the ground node. Accordingly, the potential on the bit lines /BL11 falls from the precharge level. The sense amplifiers S141 are activated and amplify the potential difference of the respective bit line pairs (BL11, /BL11). As a result, the potential on the bit lines BL11 rises to the VDD level, and the potential on the bit lines /BL11 falls to the VSS level. The H-level data DIN0 to DIN3 are thus written to the memory cells MC141 in the sub blocks SBK10 to SBK13.

The precharge level of the bit lines may vary depending on the arrangement of the memory cell arrays and the power supply lines. If the precharge level of the bit lines becomes higher than the ½ VDD level, write operation by pulling up one bit line of a bit line pair has a reduced write operation margin. If the precharge level of the bit lines becomes lower than the ½ VDD level, write operation by pulling down one bit line of a bit line pair has a reduced write operation margin.

In the DRAM of the ninth embodiment, the memory cells in the main block MBK0 capable of being recognized by the address bit A0 are written by pulling up one bit line of a bit line pair. The memory cells in the main block MBK1 capable of being recognized by the address bit A1 are written by pulling down one bit line of a bit line pair. Therefore, arranging the main block MBK1 at a position where the precharge level of the bit lines becomes higher than the ½ VDD level and providing the main block MBK0 at a position where the precharge level of the bit lines becomes lower than the ½ VDD level would increase the write operation margin.

(Tenth Embodiment)

Figure 15:
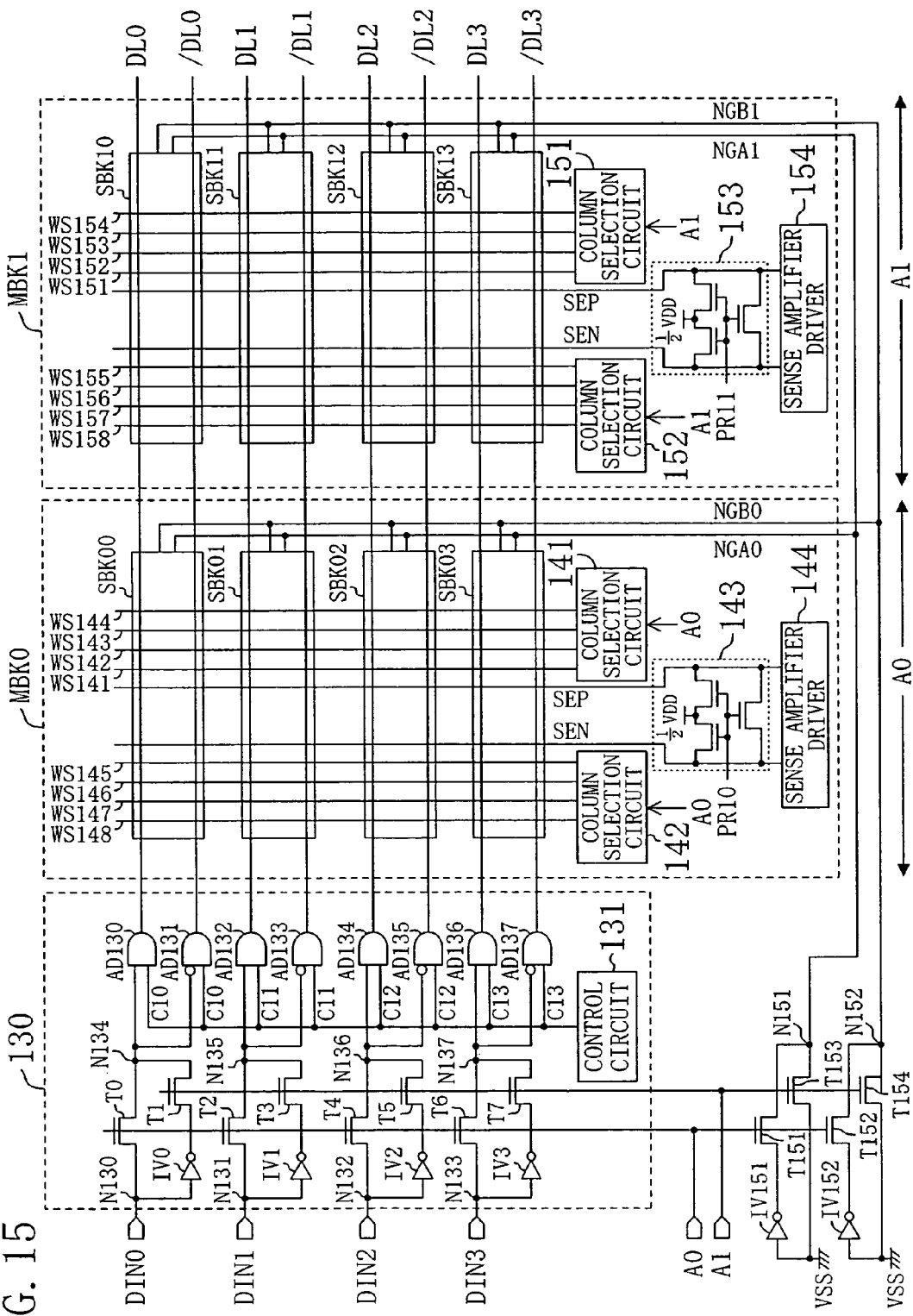
FIGS. 15, 16, 17 and 18 are block diagrams showing the overall structure of a DRAM according to tenth to thirteenth embodiments of the present invention, respectively.

FIG. 15 is a block diagram showing the overall structure of the DRAM according to the tenth embodiment of the present invention. The DRAM of FIG. 15 includes inverters IV151, IV152 and N-channel MOS transistors T151 to T154 in addition to the elements of the DRAM of FIG. 13. The inverter IV151 inverts the ground voltage VSS. The N-channel MOS transistor T151 is connected between an output node of the inverter IV151 and a node N151 and is turned ON/OFF in response to an address bit A0. The N-channel MOS transistor T153 is connected between a ground node receiving a ground voltage VSS and the node N151 and is turned ON/OFF in response to an address bit A1. The inverter IV152 inverts the ground voltage VSS. The N-channel MOS transistor T152 is connected between an output node of the inverter IV152 and a node N152 and is turned ON/OFF in response to the address bit A0. The N-channel MOS transistor T154 is connected between the ground node and the node N152 and is turned ON/OFF in response to the address bit A1.

The wirings NGA0, NGA1 have their one ends connected to the node N151 and the wirings NGB0, NGB1 have their one ends connected to the node N152.

In the above DRAM, the N-channel MOS transistors T151, T152 are turned ON and the N-channel MOS transistors T153, T154 are turned OFF when the address bit A0 is active and the address bit A1 is inactive. As a result, the power supply voltage VDD is applied to one ends of the wirings NGA0, NGB0 through the nodes N151, N152. Like the ninth embodiment, data is written to the sub blocks SBK00 to SBK03 in the main block MBK0 by pulling up one bit line of a bit line pair.

On the other hand, when the address bit A0 is inactive and the address bit A1 is active, the N-channel MOS transistors T151, T152 are turned OFF and the N-channel MOS transistors N153, N154 are turned ON. As a result, the ground voltage VSS is applied to one ends of the wirings NGA1, NGB1 through the nodes N151, N152. Like the ninth embodiment, data is written to the sub blocks SBK10 to SBK13 in the main block MBK1 by pulling down one bit line of a bit line pair.

The voltage levels on the wirings NGA0, NGB0, NGA1, NGB1 can thus be controlled to VDD or VSS according to the address bits A0, A1.

(Eleventh Embodiment)

Figure 16:
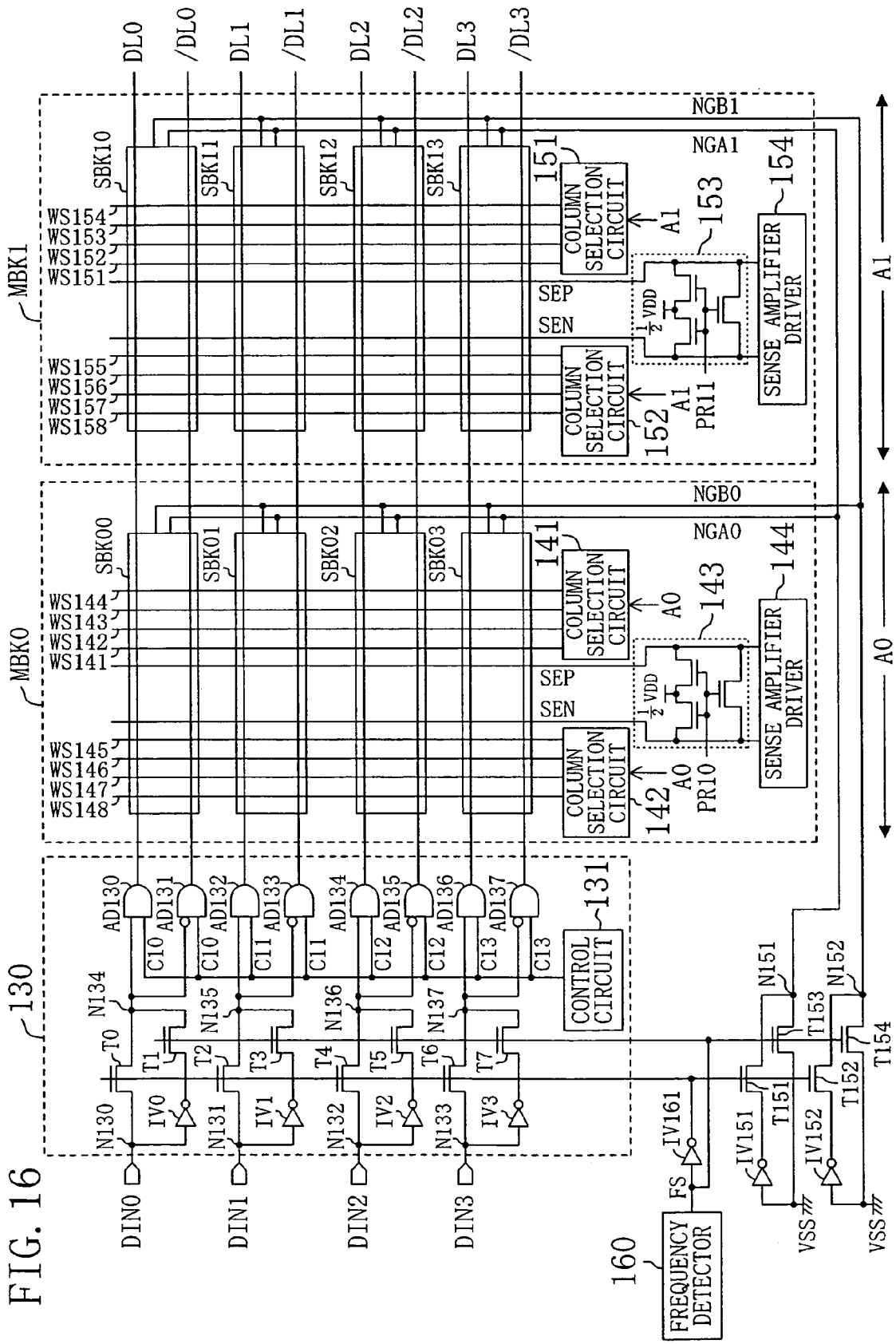

FIG. 16 is a block diagram showing the overall structure of the DRAM according to the eleventh embodiment of the present invention. The DRAM of FIG. 16 includes a frequency detector 160 and an inverter IV161 in addition to the elements of the DRAM of FIG. 15. The frequency detector 160 outputs an active determination signal FS when the operating frequency of the DRAM is a predetermined frequency or higher. Otherwise, the frequency detector 120 outputs an inactive determination signal FS. The inverter IV161 inverts the determination signal FS from the frequency detector 160. The N-channel MOS transistors T1, T3, T5, T7, T153, T154 are turned ON/OFF in response to the determination signal FS from the frequency detector 160. The N-channel MOS transistors T0, T2, T4, T6, T151, T152 are turned ON/OFF in response to the output of the inverter IV161.

Hereinafter, write operation of the above DRAM will be described.

When the operating frequency of the DRAM is lower than the predetermined frequency, the frequency detector 160 outputs an inactive determination signal FS. The N-channel MOS transistors T1, T3, T5, T7, T153, T154 are turned OFF in response to the inactive determination signal FS. On the other hand, the N-channel MOS transistors T0, T2, T4, T6, T151, T152 are turned ON in response to an active signal from the inverter IV161. As a result, a power supply voltage VDD is applied to the wirings NGA0, NGA1, NGB0, NGB1 through the nodes N151, N52. Like the ninth embodiment, data is written to the sub blocks SBK00 to SBK03 in the main block MBK0 by pulling up one bit line of a bit line pair. Similarly, data is written to the sub blocks SBK10 to SBK13 in the main block MBK1 by pulling up one bit line of a bit line pair.

When the operating frequency of the DRAM is equal to or higher than the predetermined frequency, the frequency detector 160 outputs an active determination signal FS. The N-channel MOS transistors T1, T3, T5, T7, T153, T154 are turned ON in response to the active determination signal FS. On the other hand, the N-channel MOS transistors T0, T2, T4, T6, T151, T152 are turned OFF in response to an inactive signal from the inverter IV161. As a result, a ground voltage VSS is applied to the wirings NGA0, NGA1, NGB0, NGB1 through the nodes N151, N152. Like the ninth embodiment, data is written to the sub blocks SBK10 to SBK13 in the main block MBK1 by pulling down one bit line of a bit line pair. Similarly, data is written to the sub blocks SBK00 to SBK03 in the main block MBK0 by pulling down one bit line of a bit line pair.

When the operating frequency of the DRAM is low, the ½ VDD level can be sufficiently maintained as the precharge level of the bit lines. As the operating frequency of the DRAM is increased, it becomes difficult to maintain the ½ VDD level as the precharge level of the bit lines by merely reinforcing the power supply circuit and the power supply lines. As a result, the precharge level of the bit lines is increased to a level higher than the ½ VDD level, and thus the write operation margin is reduced. In the DRAM of the eleventh embodiment, however, data is written by pulling down one bit line of a bit line pair when the operating frequency is higher than the predetermined frequency. This assures a sufficient write operation margin even at a high operating frequency. Note that the above description is given for the case where the precharge level of the bit lines rises and the write operation margin is reduced with increase in the operating frequency of the DRAM. However, there may be the case where the precharge level of the bit lines falls and the write operation margin is reduced with increase in the operating frequency of the DRAM. In this case, data is written by pulling up one bit line of a bit line pair when the operating frequency is equal to or higher than the predetermined frequency. For example, this is implemented by inverting the logic of the determination signal FS from the frequency detector 160.

(Twelfth Embodiment)

Figure 17:
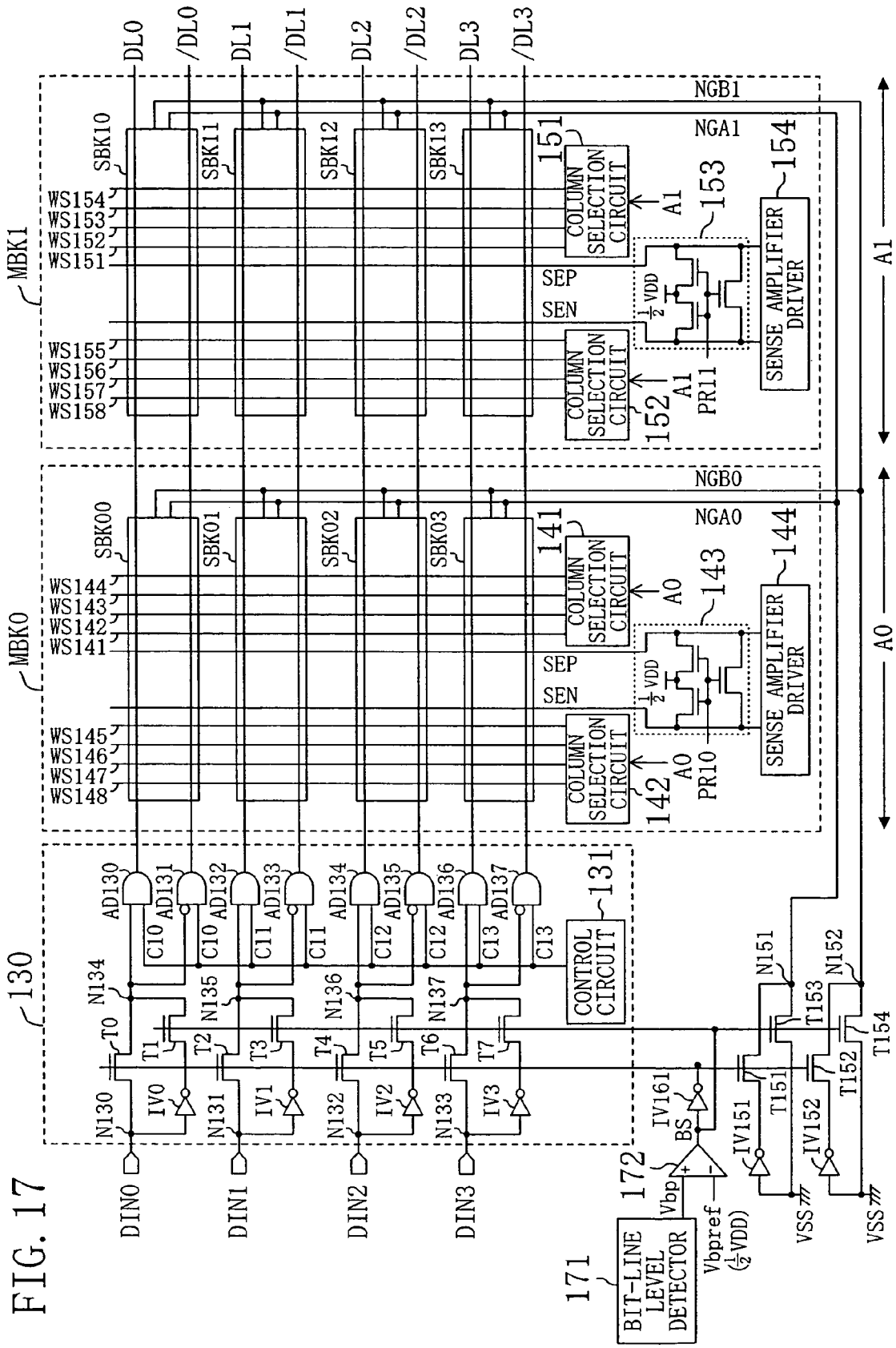

FIG. 17 is a block diagram showing the overall structure of the DRAM according to the twelfth embodiment of the present invention. The DRAM of FIG. 17 includes a bit-line level detector 171 and a comparator 172 instead of the frequency detector 160 in FIG. 16. The bit-line level detector 171 detects the voltage level on any one of the precharged bit lines in the sub blocks SBK00 to SBK03, SBK10 to SBK13, and outputs the detected voltage level to the comparator 172 as a bit line voltage Vbp. The comparator 172 compares the bit line voltage Vbp from the bit-line level detector 171 with a reference voltage Vbpref and outputs a determination signal BS according to the comparison result. The reference voltage Vbpref is a predetermined precharge level (in this example, ½ VDD). When the bit line voltage Vbp is higher than the reference voltage Vbpref, the comparator 172 outputs an active determination signal BS. When the bit line voltage Vbp is lower than the reference voltage Vbpref, the comparator 172 outputs an inactive determination signal BS. The inverter IV161 inverts the determination signal BS from the bit-line level detector 171. The N-channel MOS transistors T1, T3, T5, T7, T153, T154 are turned ON/OFF in response to the determination signal BS from the bit-line level detector 171.

Hereinafter, write operation of the above DRAM will be described.

When the bit line voltage Vbp is higher than the reference voltage Vbpref (=½ VDD), the comparator 172 outputs an active determination signal BS. The N-channel MOS transistors T1, T3, T5, T7, T153, T154 are turned ON in response to the active determination signal BS. On the other hand, the N-channel MOS transistors T0, T2, T4, T6, T151, T152 are turned OFF in response to an inactive signal from the inverter IV161. As a result, the ground voltage VSS is applied to the wirings NGA0, NGA1, NGB0, NGB1 through the nodes N151, N152. Like the ninth embodiment, data is written to the sub blocks SBK10 to SBK13 in the main block MBK1 by pulling down one bit line of a bit line pair. Similarly, data is written to the sub blocks SBK00 to SBK03 in the main block MBK0 by pulling down one bit line of a bit line pair.

When the bit line voltage Vbp is lower than the reference voltage Vbpref (=½ VDD), the comparator 172 outputs an inactive determination signal BS. The N-channel MOS transistors T1, T3, T5, T7, T153, T154 are turned OFF in response to the inactive determination signal BS. On the other hand, the N-channel MOS transistors T0, T2, T4, T6, T151, T152 are turned ON in response to an active signal from the inverter IV161. As a result, the power supply voltage VDD is applied to the wirings NGA0, NGA1, NGB0, NGB1 through the nodes N151, N152. Like the ninth embodiment, data is written to the sub blocks SBK00 to SBK03 in the main block MBK0 by pulling up one bit line of a bit line pair. Similarly, data is written to the sub blocks SBK10 to SBK13 in the main block MBK1 by pulling up one bit line of a bit line pair.

The precharge level of the bit lines is normally set to ½ VDD. However, the precharge level may be reduced from ½ VDD in order to improve "1"-level charge holding characteristics of the memory cells. In this case, a greater write operation margin is assured by pulling up one bit line of a bit line pair rather than pulling down. In the DRAM of the twelfth embodiment, data is written by pulling up one bit line of a bit line pair when the bit line voltage Vbp is lower than the reference voltage Vbpref (=½ VDD). Accordingly, a sufficient write operation margin can be assured even if the bit line voltage Vbp is lower than the reference voltage Vbpref. Similarly, a sufficient write operation margin can be assured even if the voltage level of the precharged bit lines becomes lower than ½ VDD for other reasons. In the DRAM of the twelfth embodiment, data is written by pulling down one bit line of a bit line pair when the bit line voltage Vbp is higher than the reference voltage Vbpref (=½ VDD). Accordingly, a sufficient write operation margin can be assured even if the voltage level of the precharged bit lines becomes higher than ½ VDD for some reasons.

(Thirteenth Embodiment)

Figure 18:
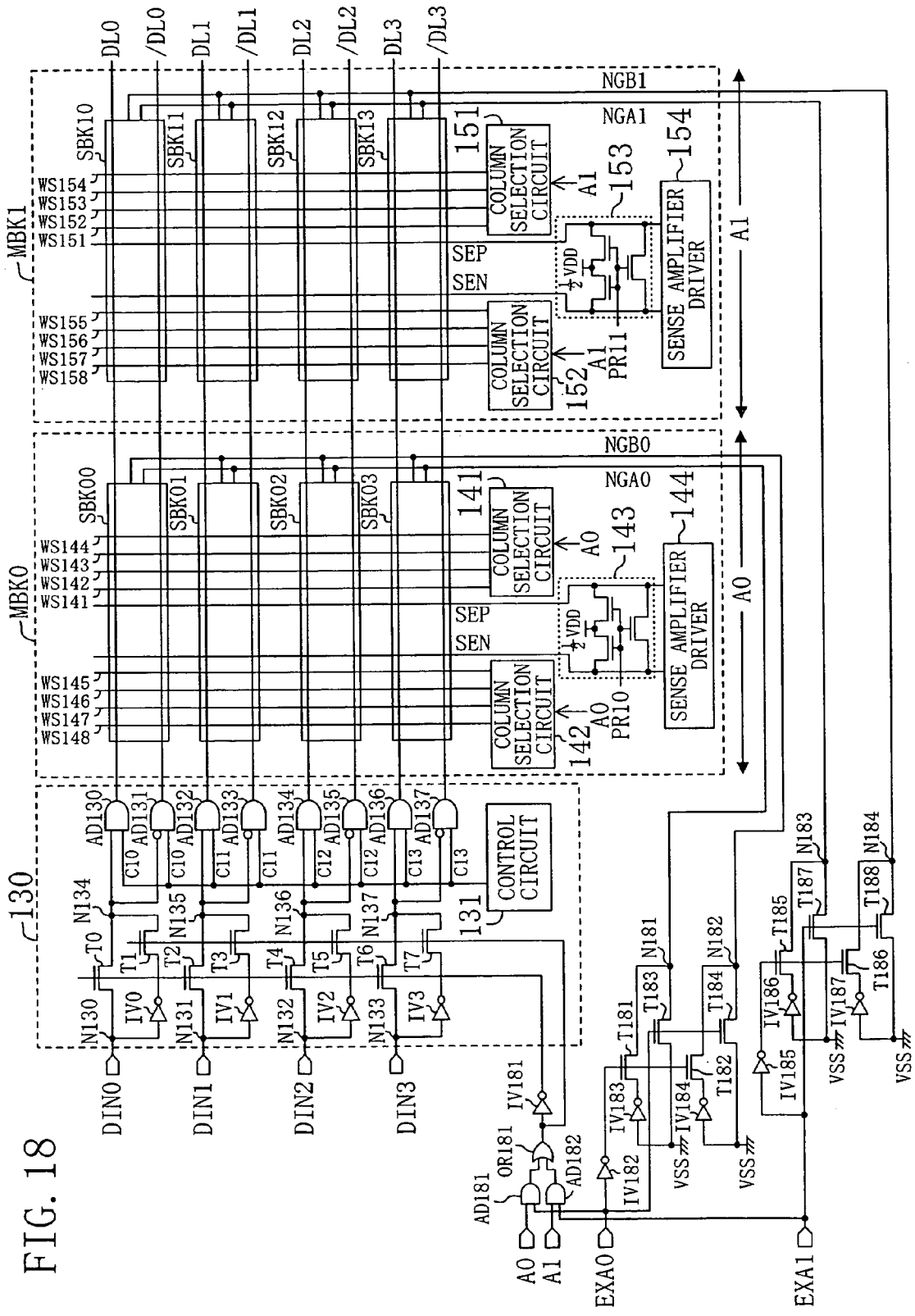
Figure 19:
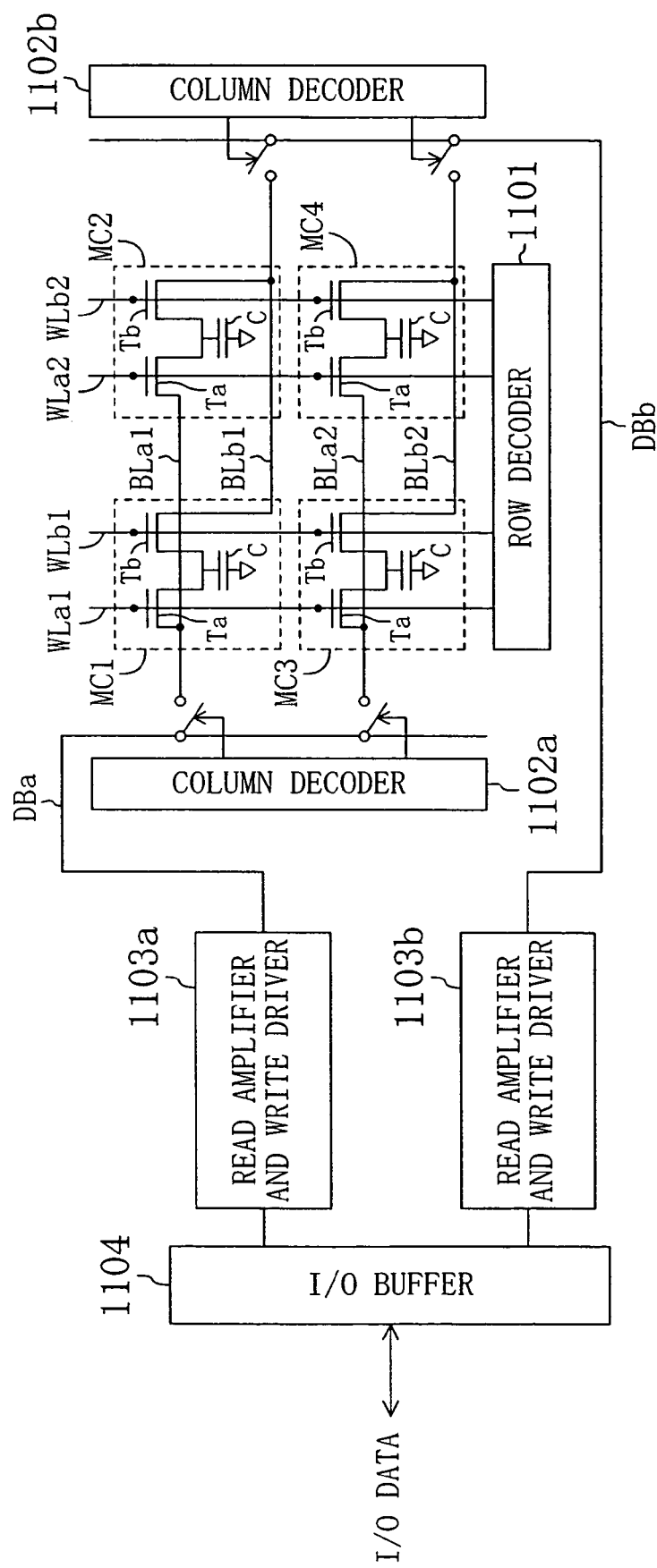
FIG. 19 is a block diagram showing the overall structure of a conventional DRAM having memory cells each including two transistors and a single capacitor.

FIG. 18 is a block diagram showing the overall structure of the DRAM according to the thirteenth embodiment of the present invention. The DRAM of FIG. 18 includes AND circuits AD181, AD182, inverters IV181 to IV187, an OR circuit OR181, and N-channel MOS transistors T181 to T188 in addition to the elements of the DRAM of FIG. 13.

The AND circuit AD181 outputs the AND operation result of an address bit A0 and a control signal EXA0. The AND circuit AD182 outputs the AND operation result of an address bit A1 and a control signal EXA1. The OR circuit OR181 outputs the OR operation result of the outputs of the AND circuits AD181, AD182. The inverter IV181 inverts the output of the OR circuit OR181. The N-channel MOS transistors T1, T3, T5, T7 are turned ON/OFF in response to the output of the OR circuit OR181. The N-channel MOS transistors T0, T2, T4, T6 are turned ON/OFF in response to the output of the inverter IV181.

The inverter IV182 inverts the control signal EXA0. The inverter IV183 inverts the ground voltage VSS. The N-channel MOS transistor T181 is connected between an output node of the inverter IV183 and a node N181 and is turned ON/OFF in response to the output of the inverter IV182. The N-channel MOS transistor T183 is connected between a ground node receiving the ground voltage VSS and the node N181 and is turned ON/OFF in response to the control signal EXA0. The inverter IV184 inverts the ground voltage VSS. The N-channel MOS transistor T182 is connected between an output nod of the inverter IV184 and a node N182 and is turned ON/OFF in response to the output of the inverter IV182. The N-channel MOS transistor T184 is connected between the ground node and the node N182 and is turned ON/OFF in response to the control signal EXA0.

The inverter IV185 inverts the control signal EXA1. The inverter IV186 inverts the ground voltage VSS. The N-channel MOS transistor T185 is connected between an output node of the inverter IV186 and a node N183 and is turned ON/OFF in response to the output of the inverter IV185. The N-channel MOS transistor T187 is connected between the ground node receiving the ground voltage VSS and the node N183 and is turned ON/OFF in response to the control signal EXA1. The inverter IV187 inverts the ground voltage VSS. The N-channel MOS transistor T186 is connected between an output node of the inverter IV187 and a node N184 and is turned ON/OFF in response to the output of the inverter IV185. The N-channel MOS transistor T188 is connected between the ground node and the node N184 and is turned ON/OFF in response to the control signal EXA1.

The wirings NGA0, NGB0, NGA1, NGB1 have their one ends connected to the nodes N181 to N184, respectively.

Hereinafter, write operation of the above DRAM will be described.

When inactive external control signals EXA0, EXA1 are applied, the N-channel MOS transistors T181, T182, T185, T186 are turned ON and the N-channel MOS transistors T183, T184, T187, T188 are turned OFF. As a result, the power supply voltage VDD is applied to the wirings NGA0, NGB0, NGA1, NGB1 through the nodes N181 to N184, respectively. When the address bit A0 is active and the address bit A1 is inactive, the N-channel MOS transistors T0, T2, T4, T6 in the write circuit 130 are turned ON and the N-channel MOS transistors T1, T3, T5, T7 in the write circuit 130 are turned OFF. Like the ninth embodiment, data is written to the sub blocks SBK00 to SBK03 in the main block MBK0 by pulling up one bit line of a bit line pair. Similarly, when the address bit A0 is inactive and the address bit A1 is active, data is written to the sub blocks SBK10 to SBK13 in the main block MBK1 by pulling up one bit line of a bit line pair.

When an active external control signal EXA0 is applied, the N-channel MOS transistors T181, T182 are turned OFF and the N-channel MOS transistors T183, T184 are turned ON. As a result, the ground voltage VSS is applied to the wirings NGA0, NGB0 through the nodes N181, N182. When the address bit A0 is active and the address bit A1 is inactive, the N-channel MOS transistors T0, T2, T4, T6 in the write circuit 130 are turned OFF and the N-channel MOS transistors T1, T3, T5, T7 in the write circuit 130 are turned ON. Data is written to the sub blocks SBK00 to SBK03 in the main block MBK0 by pulling down one bit line of a bit line pair in the same manner as that described in the ninth embodiment for the sub blocks SBK10 to SBK13 in the main block MBK1.

When an active external control signal EXA1 is applied, the N-channel MOS transistors T185, T186 are turned OFF and the N-channel MOS transistors T187, T188 are turned ON. As a result, the ground voltage VSS is applied to the wirings NGA1, NGB1 through the nodes N183, N184. When the address bit A0 is inactive and the address bit A1 is active, the N-channel MOS transistors T0, T2, T4, T6 in the write circuit 130 are turned OFF and the N-channel MOS transistors T1, T3, T5, T7 in the write circuit 130 are turned ON. Like the ninth embodiment, data is written to the sub blocks SBK10 to SBK13 in the main block MBK1 by pulling down one bit line of a bit line pair.

As has been described above, in the DRAM of the thirteenth embodiment, whether data is written to the memory cells in the main blocks MBK0, MBK1 by pulling up or pulling down one bit line of a bit line pair can be switched according to the external control signals EXA0, EXA1. Accordingly, which of the write operation by pulling up one bit line of a bit line pair and the write operation by pulling down one bit line of a bit line pair ensures a greater write operation margin can be examined for every main block MBK0, MBK1 upon testing and evaluating the chips. As a result, the memory cells in each main block MBK0, MBK1 can be written by the method ensuring a greater operation margin.

What is claimed is:

1. A semiconductor memory device, comprising:
   a first main amplifier activated in response to an active first enable signal, for amplifying data read from a first memory cell;
   a first tri-state buffer, configured to receive data provided by the first main amplifier, for driving an output node of the first tri-state buffer according to the data when the first enable signal is active and rendering the output node in a high impedance state when the first enable signal is inactive; and
   a first latch circuit for latching and outputting data of the output node of the first tri-state buffer to the outside.

2. The semiconductor memory device according to claim 1, further comprising:
   a second latch circuit; and
   a switch, connected between the output node of the tri-state buffer and the second latch circuit, for connecting the output node of the tri-state buffer to the second latch circuit in a test mode and disconnecting the output node of the tri-state buffer from the second latch circuit in a normal mode.

3. The semiconductor memory device according to claim 2, wherein either the first or second latch circuit that is not used is not allowed to conduct latch operation.

4. The semiconductor memory device according to claim 1, further comprising:
   a second main amplifier, activated in response to an active second enable signal, for amplifying data read from a second memory cell;
   a second tri-state buffer for driving an output node of the second tri-state buffer according to the data amplified by the second main amplifier when the second enable signal is active and rendering the output node in a high impedance state when the second enable signal is inactive;
   a second latch circuit for latching and outputting data of the output node of the second tri-state buffer to the outside; and
   a switch connected between an output node of the first latch circuit and an output node of the second latch circuit, and turned ON/OFF according to a bit width of read data.

5. The semiconductor memory device according to claim 4, wherein either the first or second latch circuit that is not used is not allowed to conduct latch operation.

6. A semiconductor memory device, comprising:
   an output buffer for outputting data read from a memory cell to an output terminal, wherein
   the output buffer includes
      a first buffer for receiving data read from the memory cell and driving the output terminal according to the data, and
      a second buffer, having an active state and an inactive state, for receiving the same data as the first buffer and driving the output terminal according to the data only in the active state, and
   the first buffer drives the output terminal irrespective of the active state and the inactive state.

7. A semiconductor memory device, comprising:
   an output buffer for outputting data read from a memory cell to an output terminal, wherein the output buffer includes
      a first buffer for driving the output terminal according to the data read from the memory cell, and
      a second buffer, having an active state and an inactive state, for driving the output terminal according to the read data in the active state; and
   the second buffer is activated and inactivated according to a bit width of the data read from the memory cell.

8. The semiconductor memory device according to claim 7, wherein the second buffer is activated and inactivated according to an external signal capable of recognizing the bit width of the data read from the memory cell.

9. The semiconductor memory device according to claim 7, wherein the second buffer is activated and inactivated by using a fuse element representing the bit width of the data read from the memory cell.

10. A semiconductor memory device, comprising:
    an output buffer for outputting data read from a memory cell to an output terminal; and
    a detector for detecting an operating frequency of the semiconductor memory device, wherein the output buffer includes
       a first buffer for driving the output terminal according to the data read from the memory cell, and
       a second buffer, having an active state and an inactive stated for driving the output terminal according to the read data in the active state; and
    the second buffer is activated and inactivated according to the operating frequency detected by the detector.

* * * * *